（12） United States Patent
Jain et al.

(10) Patent No.: US 11,959,189 B2
(45) Date of Patent: Apr. 16, 2024

(54) PROCESS FOR PREPARING INGOT HAVING REDUCED DISTORTION AT LATE BODY LENGTH

(71) Applicant: GlobalWafers Co., Ltd., Hsinchu (TW)

(72) Inventors: Tapas Jain, Hsinchu (TW); Sumeet S. Bhagavat, St. Charles, MO (US); Zheng Lu, O'Fallon, MO (US); Feng-Chien Tsai, Taipei (TW); Hong-Huei Huang, Shuishang Township (TW)

(73) Assignee: GlobalWafers Co., Ltd., Hsinchu (TW)

( * ) Notice: Subject to any disclaimer, the term of this patent is extended or adjusted under 35 U.S.C. 154(b) by 154 days.

(21) Appl. No.: 16/839,808

(22) Filed: Apr. 3, 2020

(65) Prior Publication Data

US 2020/0325594 A1 Oct. 15, 2020
US 2021/0269936 A9 Sep. 2, 2021
US 2022/0220631 A9 Jul. 14, 2022

Related U.S. Application Data

(60) Provisional application No. 62/832,561, filed on Apr. 11, 2019.

(51) Int. Cl.
*C30B 15/22* (2006.01)
*C30B 15/14* (2006.01)
*C30B 15/20* (2006.01)
*C30B 30/04* (2006.01)

(52) U.S. Cl.
CPC ............... *C30B 15/22* (2013.01); *C30B 15/14* (2013.01); *C30B 15/203* (2013.01); *C30B 30/04* (2013.01)

(58) Field of Classification Search
CPC ....... C30B 15/14; C30B 15/203; C30B 15/22; C30B 15/305; C30B 29/06; C30B 30/04
See application file for complete search history.

(56) References Cited

U.S. PATENT DOCUMENTS

| 5,069,741 A | 12/1991 | Kida et al. |
| 5,126,114 A | 6/1992 | Kamio et al. |
| 5,139,750 A | 8/1992 | Shima et al. |
| 5,223,077 A | 6/1993 | Kaneko et al. |
| 5,270,020 A | 12/1993 | Suzuki et al. |
| 5,871,581 A | 2/1999 | Atami et al. |
| 5,891,245 A | 4/1999 | Atami et al. |
| 5,935,320 A | 8/1999 | Graef et al. |
| 6,261,361 B1 | 7/2001 | Makoto et al. |
| 6,334,896 B1 | 1/2002 | Makoto et al. |

(Continued)

FOREIGN PATENT DOCUMENTS

| CN | 1738931 A | 2/2006 |
| CN | 101225541 A | 7/2008 |

(Continued)

OTHER PUBLICATIONS

Voronkov, Vladimiar, et al., Void Properties in Silicon Heavily Doped with Arsenic and Phosphorus, Physica Status Solidi A, vol. 209, No. 10, 2012, pp. 1898-1901.

(Continued)

*Primary Examiner* — Hua Qi
(74) *Attorney, Agent, or Firm* — Armstrong Teasdale LLP

(57) ABSTRACT

A method for growing a single crystal silicon ingot by the Czochralski method having reduced deviation in diameter is disclosed.

22 Claims, 14 Drawing Sheets

(56) References Cited

U.S. PATENT DOCUMENTS

| | | | |
|---|---|---|---|
| 6,458,202 B1* | 10/2002 | Kojima | C30B 29/06 117/207 |
| 6,569,237 B2 | 5/2003 | Tanaka et al. | |
| 6,843,847 B1 | 1/2005 | Makoto et al. | |
| 7,125,450 B2 | 10/2006 | Lu et al. | |
| 7,320,731 B2 | 1/2008 | Ono et al. | |
| 8,317,919 B2 | 11/2012 | Bender | |
| 9,051,659 B2 | 6/2015 | Deluca et al. | |
| 9,458,554 B2 | 10/2016 | Mueller et al. | |
| 2003/0140843 A1* | 7/2003 | Kanda | C30B 29/06 117/2 |
| 2004/0192015 A1* | 9/2004 | Ammon | C30B 15/14 438/502 |
| 2006/0005761 A1* | 1/2006 | Kulkarni | C30B 15/22 117/14 |
| 2006/0174819 A1* | 8/2006 | Mitamura | C30B 15/203 117/13 |
| 2007/0022943 A1* | 2/2007 | Hong | C30B 15/305 117/30 |
| 2007/0269361 A1* | 11/2007 | Kulkarni | C30B 15/00 117/931 |
| 2008/0107582 A1 | 5/2008 | Hong et al. | |
| 2009/0064923 A1* | 3/2009 | Takanashi | C30B 15/26 117/15 |
| 2009/0169460 A1* | 7/2009 | Song | C30B 15/305 423/349 |
| 2011/0030793 A1 | 2/2011 | Kraiem et al. | |
| 2012/0056135 A1 | 3/2012 | Deluca et al. | |
| 2012/0279438 A1* | 11/2012 | Ryu | C30B 15/14 117/35 |
| 2012/0301386 A1 | 11/2012 | Johnson et al. | |
| 2013/0093058 A1 | 4/2013 | Nakai | |
| 2014/0326174 A1 | 11/2014 | Mitamura | |
| 2015/0333193 A1 | 11/2015 | Appel et al. | |
| 2016/0108551 A1* | 4/2016 | Basak | C30B 15/20 117/28 |
| 2017/0362736 A1 | 12/2017 | Kim et al. | |
| 2018/0237938 A1 | 8/2018 | Basak et al. | |
| 2018/0355509 A1 | 12/2018 | Samanta et al. | |

FOREIGN PATENT DOCUMENTS

| | | | |
|---|---|---|---|
| CN | 102260900 B | 11/2013 | |
| CN | 105887194 A | 8/2016 | |
| CN | 107407003 A | 11/2017 | |
| JP | S58118089 A | 7/1982 | |
| JP | S5310495 A | 11/1993 | |
| JP | 2001089294 A | 4/2011 | |
| KR | 100869940 B1 | 11/2008 | |
| WO | 2006073614 A1 | 7/2006 | |
| WO | 2016031164 A1 | 3/2016 | |
| WO | WO-2017214084 A1 * | 12/2017 | C30B 15/007 |

OTHER PUBLICATIONS

Dash, William C., Growth of Silicon Crystals Free from Dislocations, Journal of Applied Physics, vol. 30, No. 4, 1959, pp. 459-474 (abstrct only).

Wang, J. H., "Resistivity distribution in bulk growth of silicon single crystals," Journal of Crystal Growth 275 (2005), pp. e73-e78.

Wang, J. H., "Resistivity distribution of silicon single crystals using codoping," Journal of Crystal Growth 280 (2005), pp. 408-412.

Wang, J. H. et al, Control of Axial Resistivity Distribution in Bridgman Silicon Growth,: Japanese Journal of Applied Physics, vol. 43, No. 7A (2004), pp. 4079-4081.

Forester, M. et al., "Boron-oxygen defect in Czochralski-silicon co-doped with gallium and boron," Appl. Phys. Letter 100, 042110 (2012), 8 pgs.

Glunz, S. W. et al., "Comparison of Boron- and Gallium-doped p-Type Czochralski Silicon for Photovoltaic Application," Prog. Photovolt Res. Appl. (1999), pp. 463-469.

Fourmond, E. et al., "Electrical properties of boron, phosphorus and gallium co-doped silicon," SiliconPPV Apr. 17-20, 2011, 5 pgs.

Chen, P., et al., "Gallium doped Czochralski silicon with phosphorus compensation for photovoltaic application," State Key Lab of Silicon Material, Zhejiang University, available before Dec. 28, 2016 9 pgs.

Cuevas, A. et al., Compensation Engineering for Sllicon Solar Cells, Energy Procedia 15, 2012, pp. 67-77.

International Search Report and Written Opinion issued for PCT/US2020/026684 dated Jul. 23, 2020 (16 pages).

Singapore Written Opinion and Search Report received for Application No. 11202110994T, dated Jul. 7, 2023 (10 pages).

\* cited by examiner

PROCESS FOR PREPARING INGOT HAVING REDUCED DISTORTION AT LATE BODY LENGTH

CROSS REFERENCE TO RELATED APPLICATION(S)

This application claims the benefit of priority to U.S. provisional application Ser. No. 62/832,561, filed Apr. 11, 2019, the disclosure of which is incorporated by reference as if set forth in its entirety.

FIELD OF THE DISCLOSURE

The field of the disclosure relates to a method to grow a single crystal silicon ingot using the Czochralski method.

BACKGROUND

Single crystal silicon, which is the starting material for most processes for the fabrication of semiconductor electronic components, is commonly prepared by the Czochralski ("Cz") method. In this method, polycrystalline silicon ("polysilicon") is charged to a crucible and melted, a seed crystal is brought into contact with the molten silicon, and a single crystal is grown by slow extraction. After formation of a neck is complete, the diameter of the crystal is enlarged by, for example, decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process but before the crucible is emptied of molten silicon, the crystal diameter is typically reduced gradually to form a tail end in the form of an end-cone. The end-cone usually is formed by increasing the crystal pull rate and heat supplied to the crucible. When the diameter becomes small enough, the crystal is then separated from the melt.

Czochralski growing techniques include the batch Czochralski method and the continuous Czochralski method. In batch CZ, a single polycrystalline charge is loaded into the crucible, the single charge being sufficient to grow a single crystal silicon ingot, after which the crucible is essentially depleted of silicon melt. In continuous Czochralski (CCZ) growth, polycrystalline silicon may be continually or periodically added to the molten silicon to replenish the melt during the growth process and, as a result, multiple ingots can be pulled from a single crucible during a growth process.

To carry out the CCZ process, the traditional batch Czochralski growth chamber and apparatus are modified to include a means for feeding additional polycrystalline silicon to the melt in a continuous or semi-continuous fashion without adversely affecting the properties of the growing ingot. As the seed crystal is continuously grown from the melt, solid polycrystalline silicon such as granular polycrystalline silicon is added to the melt to replenish the melt. The feed rate of the additional solid polycrystalline silicon added to the melt is typically controlled to maintain process parameters. In order to reduce the adverse effects of this replenishing activity on simultaneous crystal growth, the traditional quartz crucible is often modified to provide an outer or annular melt zone into which the added material is delivered along with an inner growth zone from which the silicon ingot is pulled. These zones are in fluid flow communication with one another.

The continuously shrinking size of the modern microelectronic device imposes challenging restrictions on the quality of the silicon substrate, which is essentially determined by the size and the distribution of the grown-in microdefects. Most of the microdefects formed in silicon crystals grown by the Czochralski (CZ) process and the Float Zone (FZ) process are the agglomerates of intrinsic point defects of silicon—vacancies and self-interstitials (or, simply, interstitials).

A series of studies have established that the interstitial agglomerates exist in two forms—globular interstitial clusters, termed B swirl defect (or B-defects), and the dislocation loops, termed A swirl defect (or A-defects). Later discovered vacancy agglomerates, known as D-defects, have been identified as octahedral voids. Voronkov provided the well-accepted explanation for the microdefect distributions observed in silicon crystals on the basis of the crystal growth conditions. According to Voronkov's model, or theory, the temperature field in the vicinity of the melt/crystal interface drives the recombination of the point defects providing driving forces for their diffusion from the melt/crystal interface—where they exist at their respective equilibrium concentrations—into the crystal bulk. The interplay between the transport of the point defects, both by the diffusion and the convection, and their recombination establishes the point defect concentration beyond a short distance away from the interface, termed the recombination length. Typically, the difference between the vacancy concentration and the interstitial concentration beyond the recombination length, termed the excess point defect concentration, remains essentially fixed away from the lateral surface of the crystal. In a rapidly pulled crystal, the spatial redistribution of the point defects by their diffusion beyond the recombination length is generally not important—with the exception of a region close to the lateral surface of the crystal that acts as a sink or a source of the point defects. Therefore, if the excess point defect concentration beyond the recombination length is positive, vacancies remain in excess, and agglomerate to form D-defects at lower temperatures. If the excess point defect concentration is negative, interstitials remain the dominant point defects, and agglomerate to form A-defects and B-defects. If the excess point defect concentration is below some detection threshold, no detectable microdefects are formed. Thus, typically, the type of grown-in microdefects is determined simply by the excess point defect concentration established beyond the recombination length. The process of establishing the excess point defect concentration is termed the initial incorporation and the dominant point defect species is termed the incorporated dominant point defect. The type of the incorporated point defects is determined by the ratio of the crystal pull-rate (v) to the magnitude of the axial temperature gradient in the vicinity of the interface (G). At a higher v/G, the convection of the point defects dominates their diffusion, and vacancies remain the incorporated dominant point defects, as the vacancy concentration at the interface is higher than the interstitial concentration. At a lower v/G, the diffusion dominates the convection, allowing the incorporation of the fast diffusing interstitials as the dominant point points. At a v/G close to its critical value, both the point defects are incorporated in very low and comparable concentrations, mutually annihilating each other and thus suppressing the potential formation of any microdefects at lower temperatures. The observed spatial microdefect distribution can be typically explained by the variation of v/G, caused by a radial non-uniformity of G and by an axial variation of v. A striking feature of the radial microdefect distribution is the oxide particles formed through the interaction of oxygen with vacancies in the regions of relatively lower incorporated vacancy concentration—at a small range of v/G marginally above the critical v/G. These particles form a narrow spatial band that can be revealed by thermal oxidation as the OSF (oxidation-induced stacking faults) ring. Quite often, the OSF ring marks the boundary between adjacent crystal regions that are vacancy-dominated and interstitial-dominated, known as the V/I boundary.

The microdefect distributions in CZ crystals grown at lower rates in many modern processes, however, are influenced by the diffusion of the point defects in the crystal bulk, including the diffusion induced by the lateral surfaces of the crystals. Therefore, an accurate quantification of the microdefect distributions in CZ crystals preferably incorporates the 2-dimensional point defect diffusion, both axially and radially. Quantifying only the point defect concentration field can qualitatively capture the microdefect distribution in a CZ crystal, as the type of the microdefects formed is directly determined by it. For a more accurate quantification of the microdefect distribution, however, capturing the agglomeration of the point defects is necessary. Traditionally, the microdefect distribution is quantified by decoupling the initial incorporation of the point defects and the subsequent formation of the microdefects. This approach ignores the diffusion of the dominant point defects in the vicinity of the nucleation region, from the regions at higher temperatures (where the microdefect density is negligible) to the regions at lower temperatures (where the microdefects exist in higher densities and consume the point defects). Alternatively, a rigorous numerical simulation based on predicting the size distributions of the microdefect populations at every location in the crystal is numerically expensive.

The transition between vacancy and interstitial dominated material occurs at a critical value of v/G, which currently appears to be about $2.5 \times 10^{-5}$ cm$^2$/sK. If the value of v/G exceeds the critical value, vacancies are the predominant intrinsic point defect, with their concentration increasing with increasing v/G. If the value of v/G is less than the critical value, silicon self-interstitials are the predominant intrinsic point defect, with their concentration increasing with decreasing v/G. Accordingly, process conditions, such as growth rate (which affect v), as well as hot zone configurations (which affect G), can be controlled to determine whether the intrinsic point defects within the single crystal silicon will be predominantly vacancies (where v/G is generally greater than the critical value) or self-interstitials (where v/G is generally less than the critical value).

Agglomerated defect formation generally occurs in two steps. First, defect "nucleation" occurs, which is the result of the intrinsic point defects being supersaturated at a given temperature; above this "nucleation threshold" temperature, intrinsic point defects remain soluble in the silicon lattice. The nucleation temperature for agglomerated intrinsic point defects is greater than about 1000° C.

Once this "nucleation threshold" temperature is reached, intrinsic point defects agglomerate; that is, precipitation of these point defects out of the "solid solution" of the silicon lattice occurs. The intrinsic point defects will continue to diffuse through the silicon lattice as long as the temperature of the portion of the ingot in which they are present remains above a second threshold temperature (i.e., a "diffusivity threshold"). Below this "diffusivity threshold" temperature, intrinsic point defects are no longer mobile within commercially practical periods of time.

While the ingot remains above the "diffusivity threshold" temperature, vacancy or interstitial intrinsic point defects diffuse through the silicon lattice to sites where agglomerated vacancy defects or interstitial defects, respectively, are already present, causing a given agglomerated defect to grow in size. Growth occurs because these agglomerated defect sites essentially act as "sinks," attracting and collecting intrinsic point defects because of the more favorable energy state of the agglomeration.

Vacancy-type defects are recognized to be the origin of such observable crystal defects as D-defects, Flow Pattern Defects (FPDs), Gate Oxide Integrity (GOI) Defects, Crystal Originated Particle (COP) Defects, crystal originated Light Point Defects (LPDs), as well as certain classes of bulk defects observed by infrared light scattering techniques such as Scanning Infrared Microscopy and Laser Scanning Tomography. Also present in regions of excess vacancies are clusters of oxygen or silicon dioxide. Some of these clusters remain small and relatively strain-free, causing essentially no harm to a majority of devices prepared from such silicon. Some of these clusters are large enough to act as the nuclei for ring oxidation induced stacking faults (OISF). It is speculated that this particular defect is facilitated by previously nucleated oxygen agglomerates catalyzed by the presence of excess vacancies. The oxide clusters are primarily formed in CZ growth below 1000° C. in the presence of moderate vacancy concentration.

Defects relating to self-interstitials are less well studied. They are generally regarded as being low densities of interstitial-type dislocation loops or networks. Such defects are not responsible for gate oxide integrity failures, an important wafer performance criterion, but they are widely recognized to be the cause of other types of device failures usually associated with current leakage problems.

In this regard it is to be noted that, generally speaking, oxygen in interstitial form in the silicon lattice is typically considered to be a point defect of silicon, but not an intrinsic point defect, whereas silicon lattice vacancies and silicon self-interstitials (or, simply, interstitials) are typically considered to be intrinsic point defects. Accordingly, essentially all microdefects may be generally described as agglomerated point defects, while D-defects (or voids), as well as A-defects and B-defects (i.e., interstitial defects) may be more specifically described as agglomerated intrinsic point defects. Oxygen clusters are formed by absorbing vacancies; hence, oxygen clusters can be regarded as agglomerates of both vacancies and oxygen.

It is to be further noted that the density of such vacancy and self-interstitial agglomerated point defects in Czochralski silicon historically has been within the range of about $1 \times 10^3$/cm$^3$ to about $1 \times 10^7$/cm$^3$, whereas the density of oxygen clusters varies between around $1 \times 10^8$/cm$^3$ to $1 \times 10^{10}$/cm$^3$. Agglomerated intrinsic point defects are therefore of rapidly increasing importance to device manufacturers, because such defects can severely impact the yield potential of the single crystal silicon material in the production of complex and highly integrated circuits.

In view of the foregoing, in many applications it is preferred that a portion or all of the silicon crystal, which is subsequently sliced into silicon wafers, be substantially free of these agglomerated intrinsic point defects. To-date, several approaches for growing substantially defect-free silicon crystals have been reported. Generally speaking, all these approaches involve controlling the ratio v/G, in order to determine the initial type and concentration of intrinsic point defects present in the growing CZ single crystal silicon crystal. Additionally, however, such approaches may involve controlling the subsequent thermal history of the crystal to allow for prolonged diffusion time to suppress the concentration of intrinsic point defects therein, and thus substantially limit or avoid the formation of agglomerated intrinsic point defects in a portion or all of the crystal. (See, for example, U.S. Pat. Nos. 6,287,380; 6,254,672; 5,919,302; 6,312,516 and 6,328,795; the entire contents of which are hereby incorporated herein by reference.) Alternatively, however, such approaches may involve a rapidly cooled silicon (RCS) growth process, wherein the subsequent thermal history of the crystal is then controlled to rapidly cool at least a portion of the crystal through a target nucleation temperature, in order to control the formation of agglomerated intrinsic point defects in that portion. One or both of these approaches may also include allowing at least a portion of the grown crystal to remain above the nucleation temperature for a prolonged period of time, to reduce the concentration of intrinsic point defects prior to rapidly cooling this portion of the crystal through the target nucleation temperature, thus substantially limiting or avoiding the formation of agglomerated intrinsic point defects therein. (See, e.g., U.S. Patent Application Publication No. 2003/0196587, the entire disclosure of which is incorporated herein by reference.) Still further, methods have been developed to reduce or eliminate agglomerated point defects from the center of the ingot to the edge by the simultaneous control of the cooling rate of the solidified ingot and the radial variation of the axial temperature gradient in the vicinity of the interface (G). (See, e.g., U.S. Pat. No. 8,673,248, the entire disclosure of which is incorporated herein by reference.)

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method of preparing a single crystal silicon ingot by the Czochralski method. The method comprises adding an initial charge of polycrystalline silicon to a crucible contained within a growth chamber, wherein the crucible comprises a bottom wall and a sidewall and further wherein the growth chamber comprises a bottom heater located next to the bottom wall of the crucible, a side heater located next to the sidewall, and a reflector; supplying power to the bottom heater, the side heater, or both the bottom heater and side heater to thereby heat the crucible comprising the initial charge of polycrystalline silicon to cause a silicon melt to form in the crucible, wherein the power supplied to the side heater is greater than the power supplied to the bottom heater and further wherein the silicon melt has a free melt elevation level; contacting a silicon seed crystal with the silicon melt contained within the crucible; withdrawing the silicon seed crystal from the silicon melt in a direction perpendicular to the melt elevation level at an initial pull rate to thereby form a solid neck portion of the single crystal silicon ingot; withdrawing a solid outwardly flaring seed-cone adjacent the neck portion of the single crystal silicon ingot from the silicon melt by modifying the initial pull rate to thereby achieve an outwardly flaring seed-cone pull rate; and withdrawing a solid main body of the single crystal silicon ingot adjacent the outwardly flaring seed-cone from the silicon melt by modifying the outwardly flaring seed-cone pull rate to thereby achieve a main body pull rate, wherein the solid main body of the single crystal silicon ingot has a radial diameter and an axial length and surface tension arising as the solid main body of the single crystal silicon ingot is withdrawn from the molten silicon results in a melt-solid interface located above the free melt elevation level and further wherein a meniscus comprising molten silicon is between the melt-solid interface and the free melt elevation level; wherein a cusp magnetic field is applied to the silicon melt during growth of the main body of the single crystal silicon ingot; and wherein a heat flux in an axial direction between the melt-solid interface and the free melt elevation level during growth of at least 40% of a total axial length of the solid main body of the single crystal silicon ingot has an absolute value of at least about 20,000 $W/m^2$ over at least about 85% of the radial length of the solid main body of the single crystal silicon ingot.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

according to an embodiment of the present invention. Temperatures and heat flux data were obtained after 400 mm growth and after 800 mm growth.

Figure 13A:
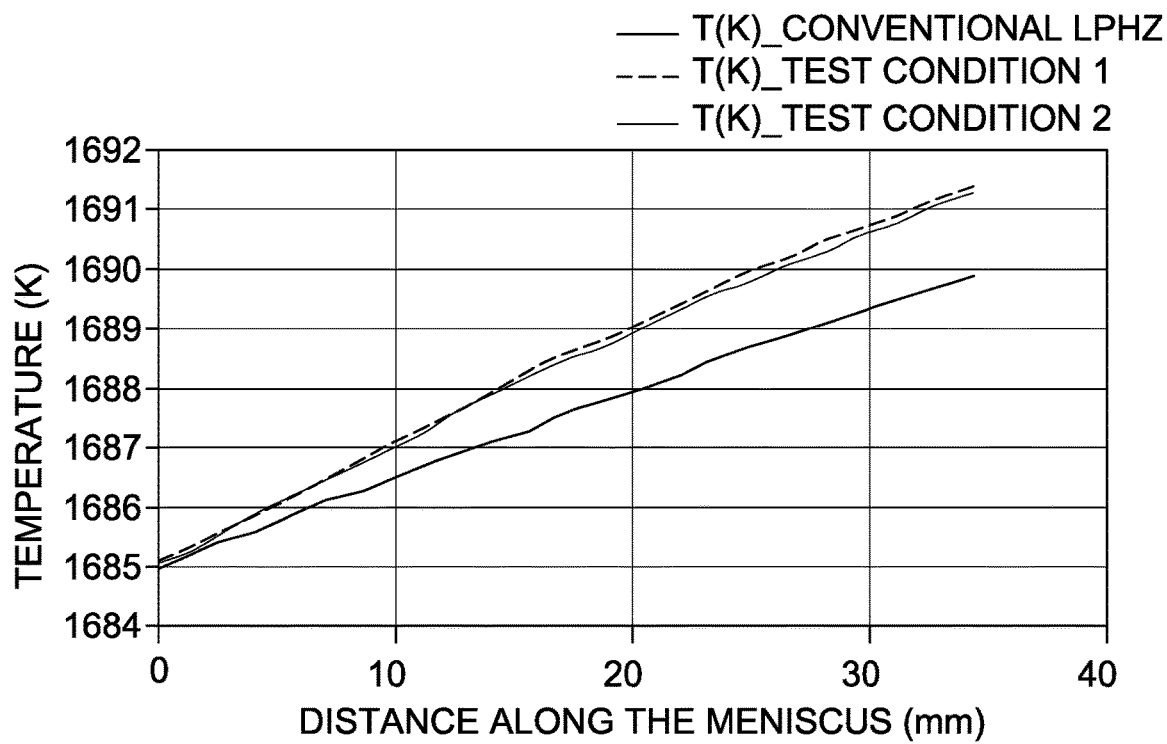
Figure 13B:
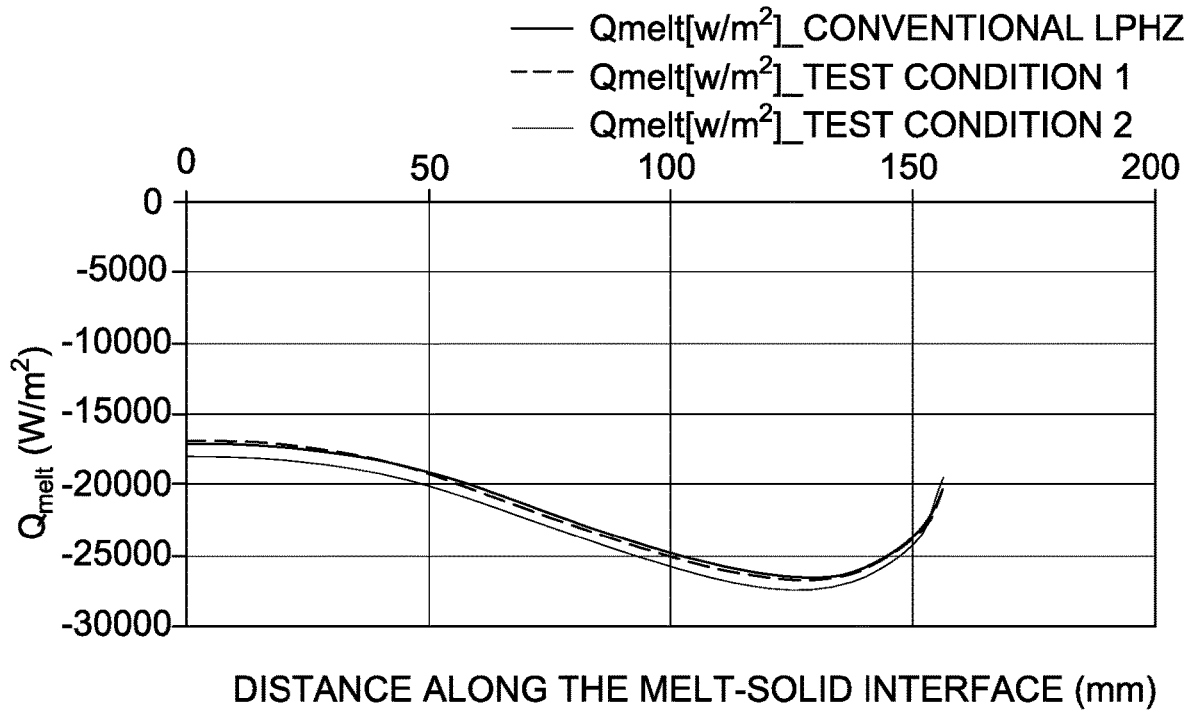

FIGS. 13A and 13B depict meniscus temperature profile (FIG. 13A) and heat flux on the melt side (FIG. 13B) according to an embodiment of the present invention.

Figure 14A:
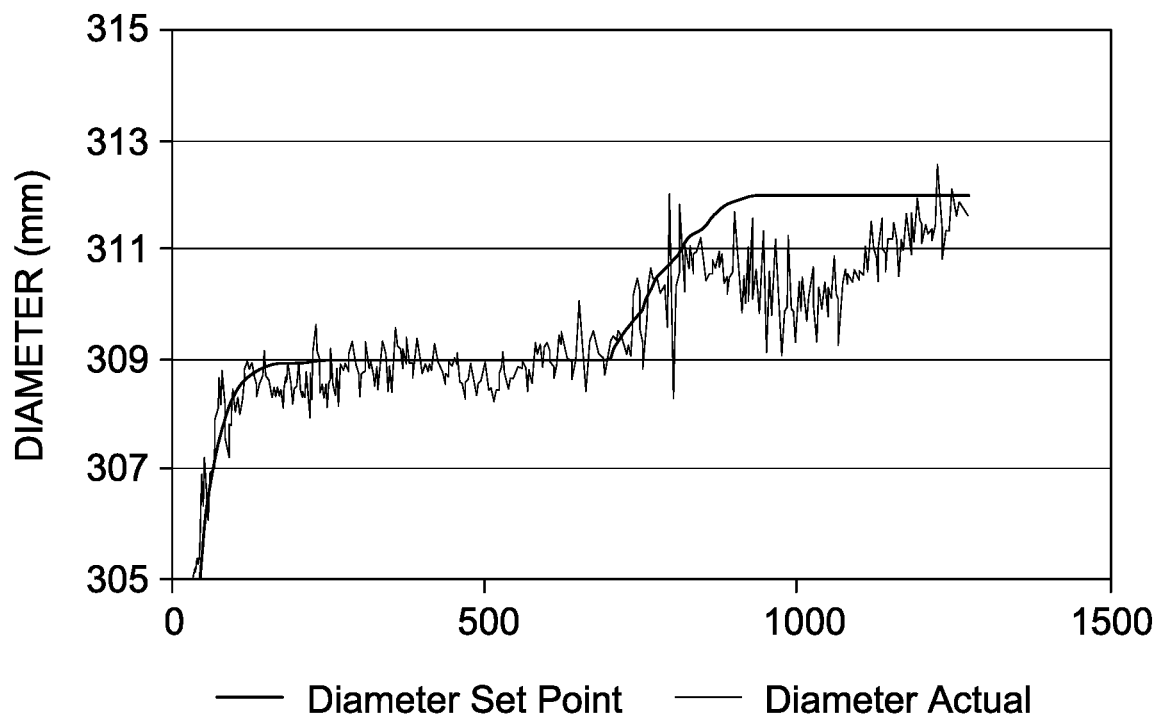
Figure 14B:
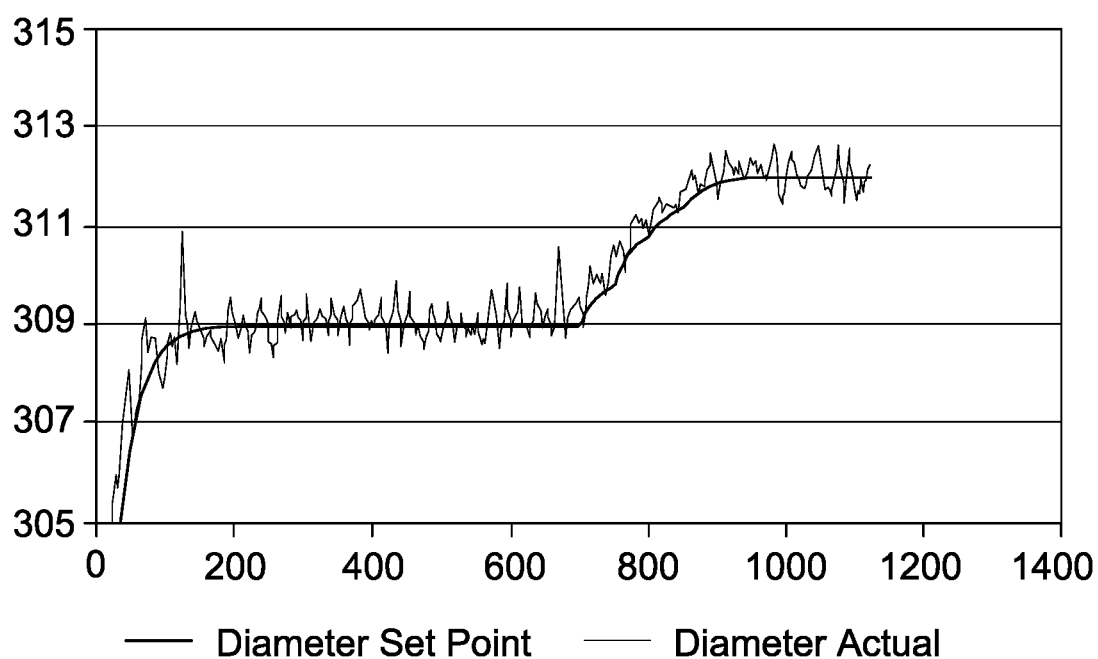

FIGS. 14A and 14B depict diameter of a single crystal silicon ingot during main body growth during a conventional low power hot zone process (FIG. 14A) and during a process according to an embodiment of the present invention (FIG. 14B).

Corresponding reference characters indicate corresponding parts throughout the drawings.

DETAILED DESCRIPTION

According to the method of the present invention, a single crystal silicon ingot is grown by the Czochralski (CZ) method under process conditions suitable to inhibit or prevent ingot distortion during late body length (after 600 mm) growth in a low power hot zone type. It has been observed during ingot growth in a low power hot zone growth chamber, the cross-section of the crystal may alter from the initial desired circular shape to a star shape during later growth of the main body of the single crystal silicon ingot. Disadvantageously, the distortion may cause the camera which monitors ingot growth conditions to lose track of the growing ingot and shape of the meniscus during the growth process. According to some embodiments, suitable growth conditions are selected during growth of the ingot to suppress the drop in the melt temperatures near the crystal/melt interface and meniscus, which in turn reduces the potential of supercooling and thus distortion. That is, conditions are selected to minimize temperature changes at the free melt surface level as well as the melt under the melt/crystal interface during growth of the entire length of the ingot, which in turn minimizes or eliminates distortion so that cross sections of the ingot retain the desired circular shape along the entire length of the ingot.

The method of the present invention may be applied to Czochralski pullers with an applied magnetic field, e.g., cusp magnetic field, and added insulation in the bottom portion of the hot zone, which is referred to as low power hot zone (LPHZ). The regular hot zone pullers usually have a requirement of high bottom heater power during the growth process. The low power hot zone is a modification of the regular hot zones where the bottom heater power requirement was reduced by installing additional insulation at the bottom to prevent escaping of heat from the bottom, which helped in reducing the power consumption and cost of production.

Figure 1A:
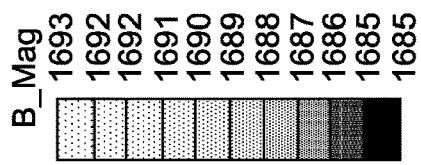
FIGS. 1A and 1B illustrate melt temperature profile near the crystal/melt interface for a regular hot zone (FIG. 1A) and a low power hot zone (FIG. 1B).
Figure 1A:
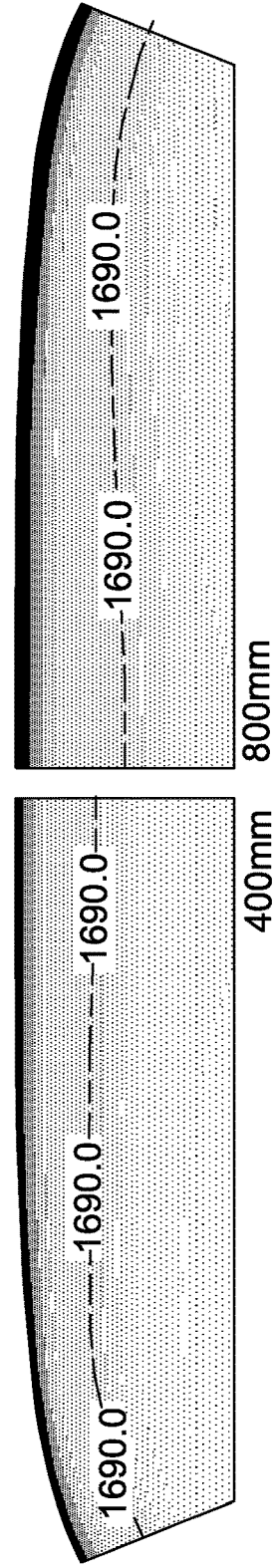
Figure 1B:
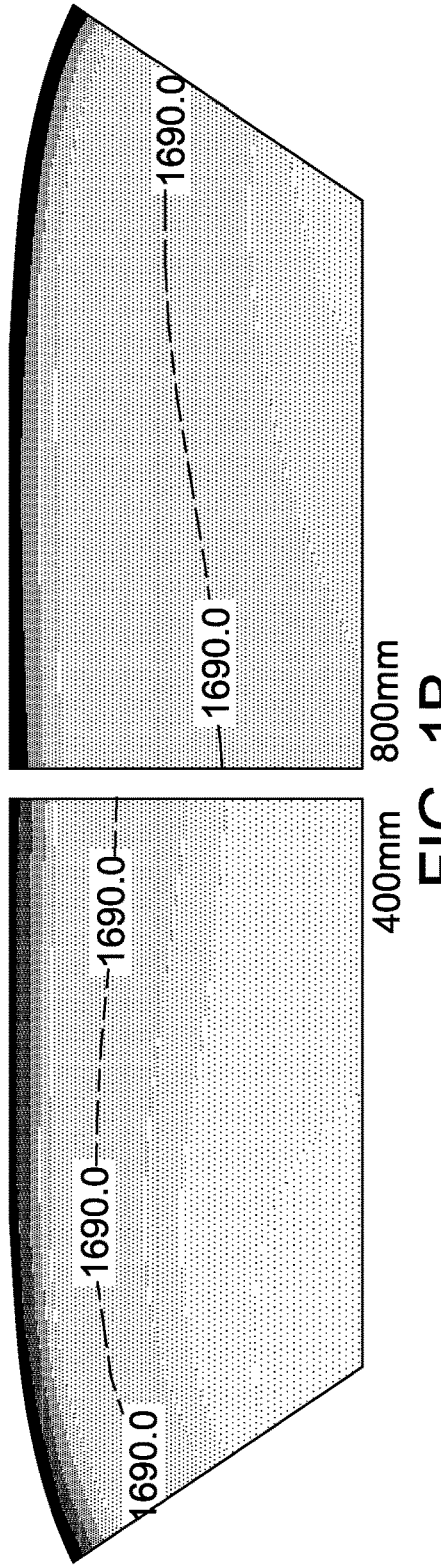

Crystal growth in low power hot zones are more prone to have ingot distortion at late body length (after 600 mm), and this problem is not commonly observed in regular hot zone pullers in which the bottom heater is set to high power. According to current understanding, the distortion at late body length results at least in part from the melt temperature near the melt/crystal interface. FIGS. 1A and 1B compare the thermal field in the melt at an early body length (400 mm) and late body length (800 mm) in an ingot grown in a regular hot zone (FIG. 1A) and a low power hot zone (FIG. 1B). The figures illustrate the temperatures in the melt near the crystal/melt interface. As shown in FIG. 1B, these temperatures had dropped significantly in the low power hot zones at late body length, whereas the temperature difference was quite less in the regular hot zones, as shown in FIG. 1A. For illustration a contour at T=1690 K is highlighted in each of the thermal field for comparison in FIGS. 1A and 1B.

Figure 2A:
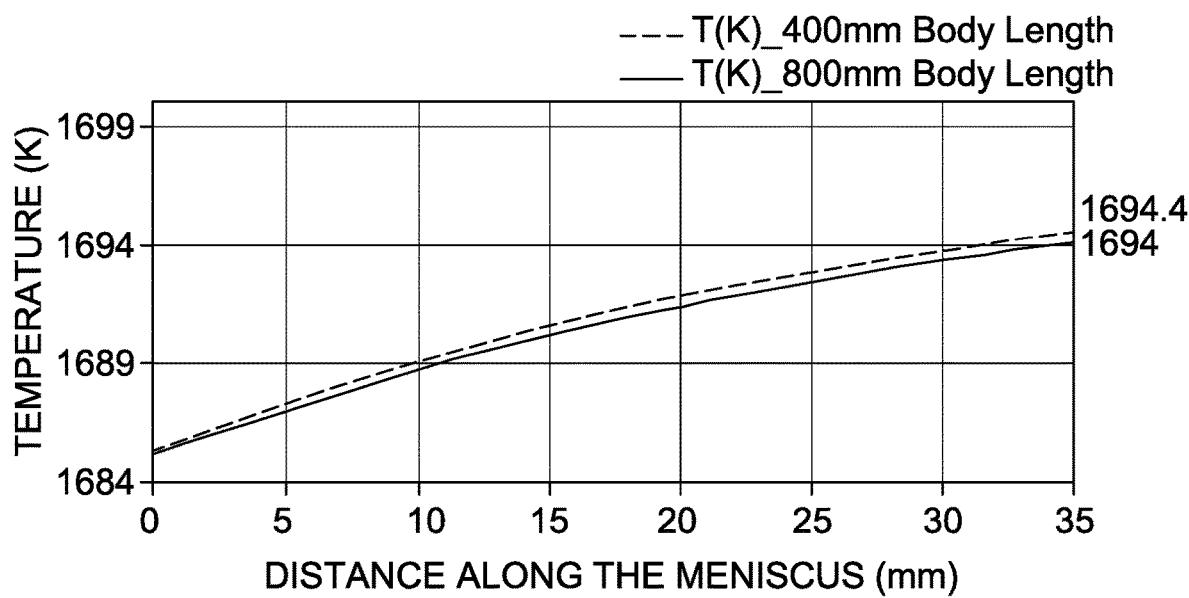
FIGS. 2A and 2B illustrate melt temperature profile near the meniscus for a regular hot zone (FIG. 2A) and a low power hot zone (FIG. 2B). Temperatures were obtained after 400 mm growth and after 800 mm growth.
Figure 2B:
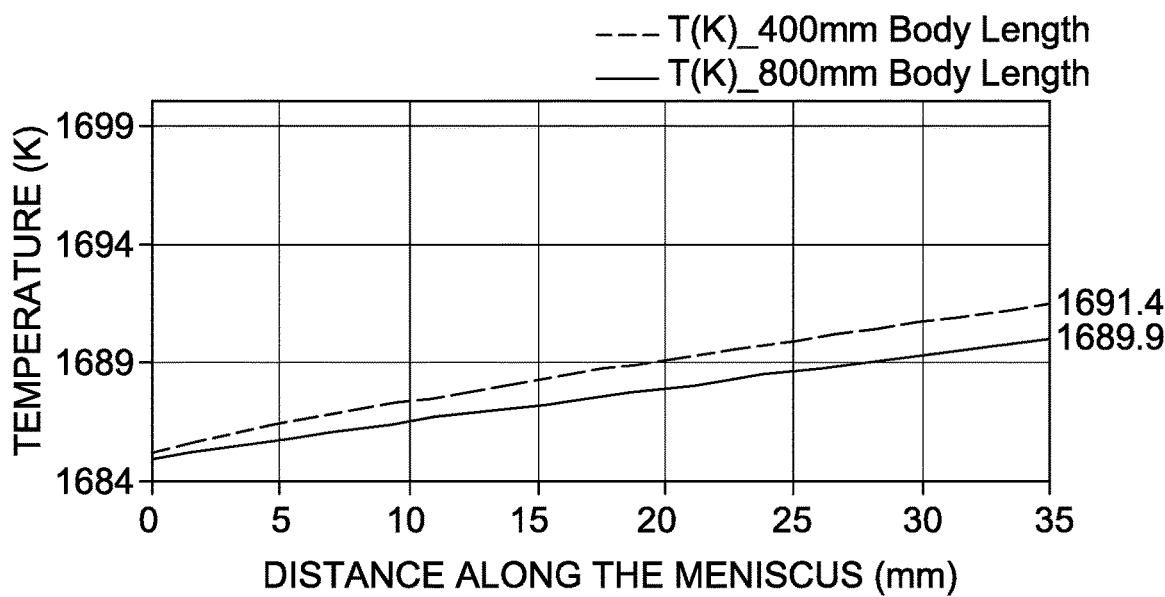
Figure 6:
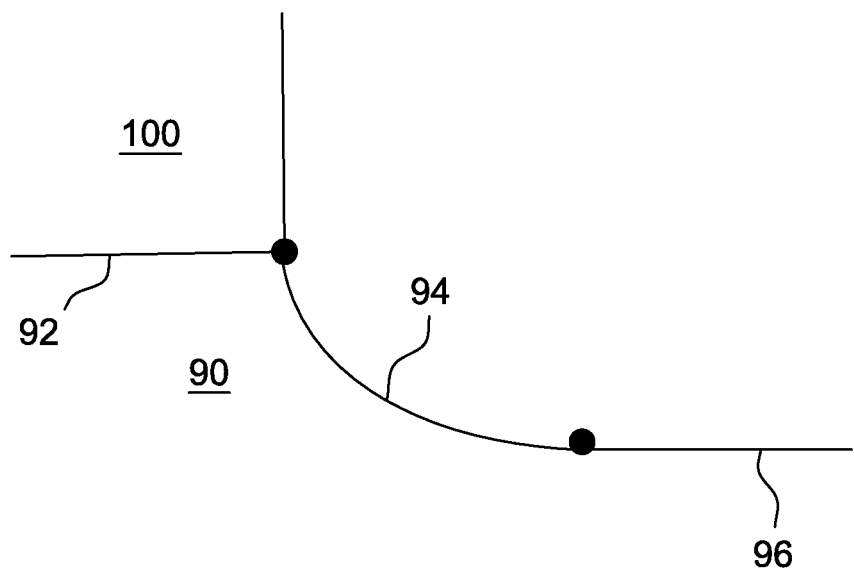
FIG. 6 is an illustration showing an enlarged view of portion A indicated in FIG. 3, depicting the meniscus curve between the melt-solid interface and the melt elevation level.

FIGS. 2A (regular hot zone) and 2B (low power hot zone) are graphs depicting the temperature profiles along the meniscus curve at early and late body length for both hot zone types. As shown in FIG. 2A, in regular hot zone, the meniscus end temperature, i.e., at the melt free interface, at late body length, i.e. 800 mm, is around 1694 K (where no distortion was seen at this stage) which is very close to the early body, i.e., 400 mm meniscus temperature at the melt free interface of 1694.4K. See FIG. 6 for a depiction of the meniscus 94 having a curve extending between a solid-melt interface 92 and a melt free interface 96 (which may be also referred to herein as a free melt elevation level, melt elevation level, free melt surface, free melt surface level, melt surface, or melt level). The distance 0 mm in FIG. 2A corresponds to the point along the curve of the meniscus 94 intersecting the solid-melt interface 92, while the distance 35 mm corresponds to the point along the curve of the meniscus 94 intersecting the melt free interface 96. These distances may vary depending upon hot zone design and pull conditions. As depicted in FIG. 2B, during crystal growth in a low power hot zone, the meniscus temperature at the melt free interface 96 for 800 mm has dropped to a value of 1689.9 K at 800 mm growth, and has a significant difference from the temperature of 1691.4 K at 400 mm body length. It can also be observed from FIGS. 2A and 2B that the gradient of temperature has also decreased from 400 mm to 800 mm body length at the solid-melt interface 92 as well as along the curve of the meniscus 94 for low power hot zone. It is possible that these changes are responsible for increased likelihood of distortion at 800 mm body length in a low power hot zone configuration.

According to the method of the present invention, hot zone conditions are selected to increase the melt side heat flux and gradient along the meniscus during growth of the full body length of a single crystal silicon ingot. Suitable process conditions that are selected according to some embodiments of the present invention include bottom heater power, relative crucible height, seed rotation rate, crucible rotation rate, and magnetic field strength a suitable condition was found. Certain variables, including relative crucible height (RH), seed rotation rate, bottom heater power, and magnetic field position were discovered to increase melt side heat flux and thereby increase the temperatures near the melt and the temperature gradients along the meniscus. In turn, the temperature profiles achieved according to the method of the present invention resulted in ingots grown to have reduced or eliminated distortion throughout the body length of the ingot.

Figure 3:
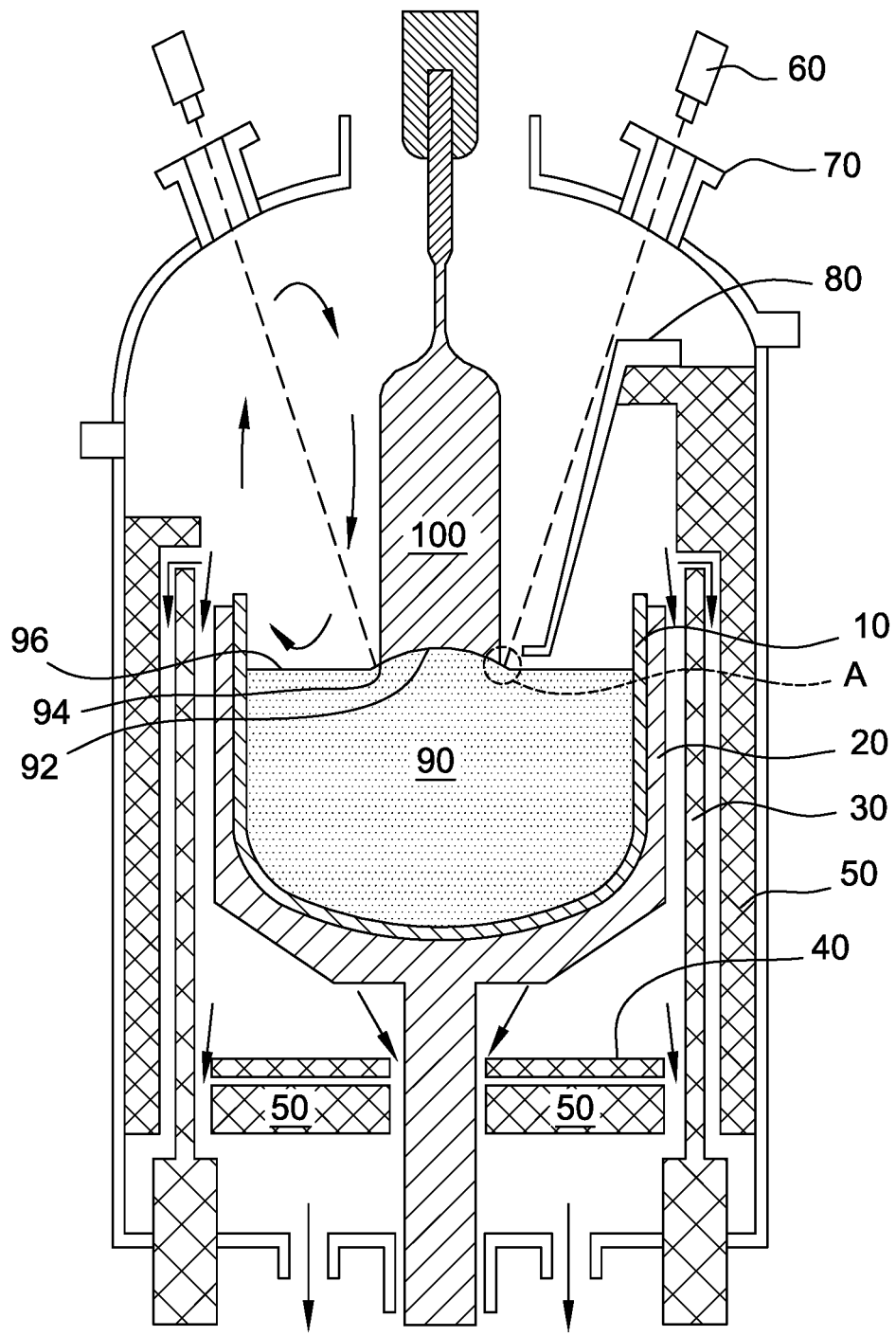
FIG. 3 is a depiction of a hot zone suitable for carrying out the method of the present invention.

FIG. 3 is a depiction of a hot zone suitable for carrying out the method of the present invention. The hot zone configuration includes a quartz crucible 10 of suitable diameter for holding a silicon melt and for pulling an ingot having a diameter of 450 mm or more. A graphite crucible 20 envelopes and supports the quartz crucible 10. Other configurations for holding the quartz crucible 10 are within the scope of the method of the present invention, e.g., a configuration that lacks the graphite crucible 20. The hot zone configuration includes a side heater 30 located near the sidewalls of the crucible 10 and optionally a bottom heater 40 located below the crucible 10. The hot zone configuration includes insulation 50 configured to retain heat within the hot zone. The low power hot zone according to the present invention includes additional insulation 50 near the bottom of the crucible 10. The growing crystal diameter and the shape and height of the meniscus 94 is monitored by a camera 60 (e.g., a CCD camera) located at the top window 70. Data obtained from the camera enables feedback to the side heater 30 and bottom heater 40. During crystal growth, the power distribution may be adjusted between the heaters to enable uniformity of the melt/solid interface 92, i.e., maintain the desired shape and height of the meniscus 94. The heat shield or reflector 80 reflects heat flux from the hot part of the furnace including the heater 30, 40 and crucible 10 to the melt 90. The reflector 80 reduces heat transfer from the hot part to the cold part of the furnace and thereby maintains a separation between these two regions of the furnace. The reflector 80 helps control the axial and radial temperature gradients, which drive the solidification and crystallization of the molten silicon 90 into the growing ingot 100.

The Czochralski method begins by loading polycrystalline silicon into a quartz crucible 10, with reference to FIG. 3. The solid polysilicon added to the crucible 10 is typically granular polysilicon, although chunk poly silicon may be used, and it is fed into the crucible using a polysilicon feeder that is optimized for use with granular polysilicon. Chunk polysilicon typically has a size of between 3 and 45 millimeters (e.g., the largest dimension), and granular polysilicon typically has a size between 400 and 1400 microns. Granular polysilicon has several advantages including providing for easy and precise control of the feed rate due to the smaller size. However, the cost of granular polysilicon is typically higher than that of chunk polysilicon due to the chemical vapor deposition process or other manufacturing methods used in its production. Chunk polysilicon has the advantage of being cheaper and being capable of a higher feed rate given its larger size.

Generally, the melt 90 from which the ingot 100 is drawn is formed by loading polycrystalline silicon into a crucible 10 to form an initial silicon charge. In general, an initial charge is between about 100 kilograms and about 1000 kilograms, or between about 100 kilograms and about 800 kilograms, or between about 100 kilograms and about 500 kilograms, of polycrystalline silicon, which may be granular, chunk, or a combination of granular and chunk. The mass of the initial charges depends on the desired crystal diameter and HZ design. In some embodiments, the initial polycrystalline silicon charge is sufficient to grow one single crystal silicon ingot, i.e., in a batch method. In general, the total axial length of the solid main body of the single crystal silicon ingot is at least about 1100 mm, such as between about 1200 mm and about 1300 mm, such as between about 1200 mm and about 1250 mm. In a continuous Czochralski method, the initial charge does not reflect the length of crystal, because polycrystalline silicon is continuously fed during crystal growth. Accordingly, the initial charge may be smaller, such as between about 100 kg and about 200 kg. If polycrystalline silicon is fed continuously and the chamber height is tall enough, crystal length can be extended to 2000 mm, 3000 mm, or even 4000 mm in length. A variety of sources of polycrystalline silicon may be used including, for example, granular polycrystalline silicon produced by thermal decomposition of silane or a halosilane in a fluidized bed reactor or polycrystalline silicon produced in a Siemens reactor. Once polycrystalline silicon is added to the crucible to form a charge, the charge is heated to a temperature above about the melting temperature of silicon (e.g., about 1412° C.) to melt the charge, and thereby form a silicon melt comprising molten silicon. The silicon melt has an initial volume of molten silicon and has an initial melt elevation level, and these parameters are determined by the size of the initial charge. In some embodiments, the crucible comprising the silicon melt is heated to a temperature of at least about 1425° C., at least about 1450° C. or even at least about 1500° C. The initial polycrystalline silicon charge is heated by supplying power to the bottom heater 40, the side heater 30, or both the bottom heater 40 and side heater 30. According to some embodiments, the power supplied to the side heater 30 is greater than the power supplied to the bottom heater 40. In some embodiments, the bottom heater power 40 is 2 kW or less, such as 1 kW or less. In some embodiments, the bottom heater 40 has no power supplied thereto, i.e., the power supplied is 0 kW, such that the hot zone configuration is a low power hot zone configuration. The low power hot zone according to the present invention includes additional insulation 50 near the bottom of the crucible 10.

Figure 4:
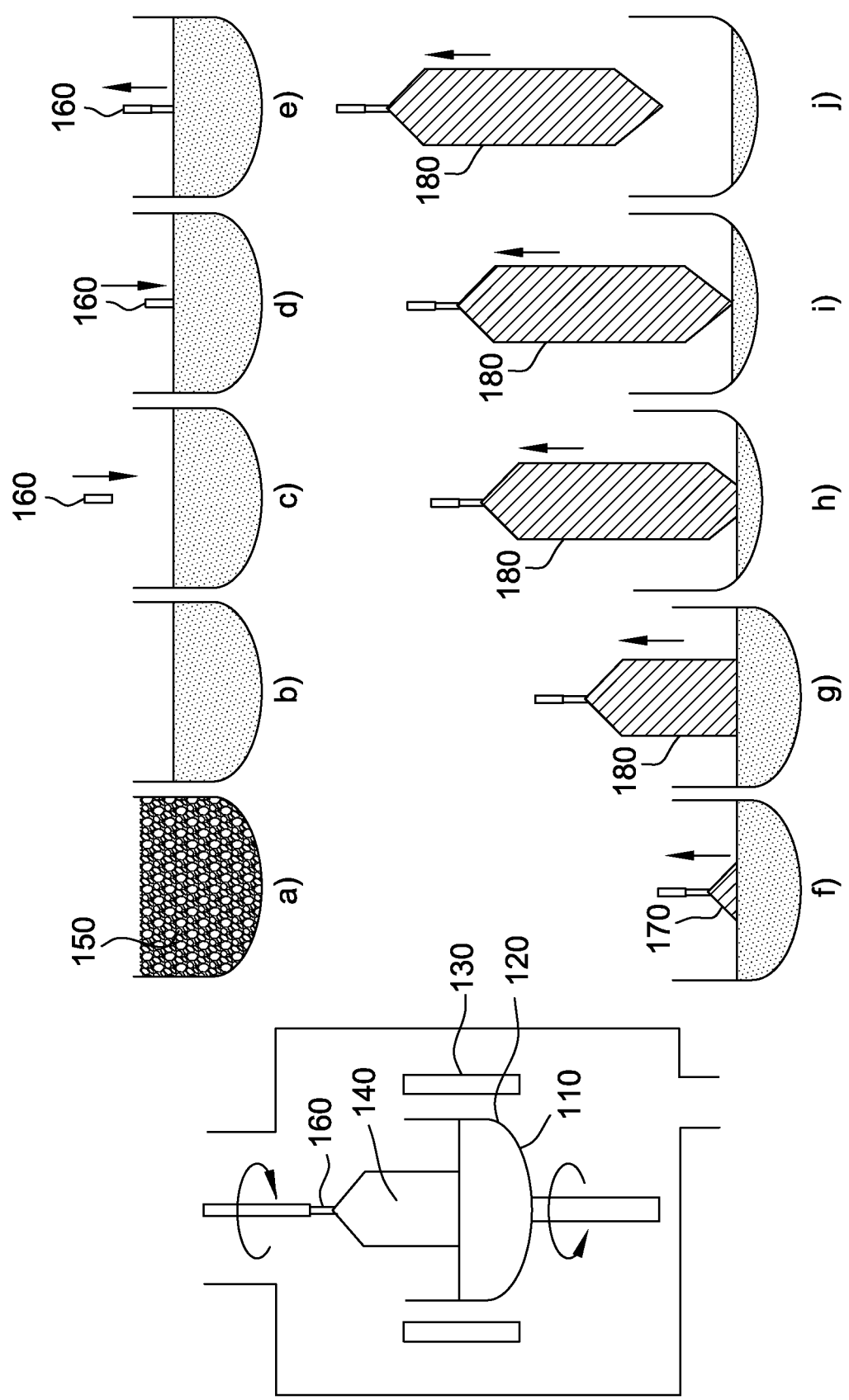
FIG. 4 is a series of illustrations depicting movement of the crucible during growth of an ingot during a batch Czochralski method.

With reference to FIG. 4, once the solid polycrystalline silicon charge 150 is liquefied to form a silicon melt 120 comprising molten silicon, the silicon seed crystal 160 is lowered to contact the melt. The silicon seed crystal 160 is then withdrawn from the melt with silicon being attached thereto to thereby forming a melt-solid interface near or at the surface of the melt. Generally, the initial pull speed to form the neck portion is high. In some embodiments, the silicon seed crystal and neck portion is withdrawn at a neck portion pull rate of at least about 1.0 mm/minute, such as between about 1.5 mm/minute and about 6 mm/minute, such as between about 3 mm/minute and about 5 mm/minute. In some embodiments, the silicon seed crystal and the crucible are rotated in opposite directions, i.e., counter-rotation. Counter-rotation achieves convection in the silicon melt. Rotation of crystal is mainly used to provide a symmetric temperature profile, suppress angular variation of impurities and also to control crystal melt interface shape. In some embodiments, the silicon seed crystal is rotated at a rate of between about 5 rpm and about 30 rpm, or between about 5 rpm and about 20 rpm, or between about 5 rpm and about 15 rpm, such as about 8 rpm, 9 rpm, or 10 rpm. In some embodiments, the seed crystal rotation rate may change during growth of the main body of the single crystal silicon ingot. In some embodiments, the crucible is rotated at a rate between about 0.5 rpm and about 10 rpm, or between about 1 rpm and about 10 rpm, or between about 4 rpm and about 10 rpm, or between about 5 rpm and about 10 rpm. In some embodiments, the seed crystal is rotated at a faster rate than the crucible. In some embodiments, the seed crystal is rotated at a rate that is at least 1 rpm higher than the rotation rate of the crucible, such as at least about 3 rpm higher, or at least about 5 rpm higher. In general, the neck portion has a length between about 300 millimeters and about 700 millimeters, such as between about 450 millimeters and about 550 millimeters. However, the length of the neck portion may vary outside these ranges.

After formation of the neck, the outwardly flaring seed-cone portion 170 adjacent the neck is grown, with reference to FIG. 4. In general, the pull rate is decreased from the neck portion pull rate to a rate suitable for growing the outwardly flaring seed-cone portion. For example, the seed-cone pull rate during growth of the outwardly flaring seed-cone 170 is between about 0.5 mm/min and about 2.0 mm/min, such as about 1.0 mm/min. In some embodiments, the outwardly flaring seed-cone 170 has a length between about 100 millimeters and about 400 millimeters, such as between about 150 millimeters and about 250 millimeters. The length of the outwardly flaring seed-cone 170 may vary outside these ranges. In some embodiments, the outwardly flaring seed-cone 170 is grown to a terminal diameter of about 150 mm, at least about 150 millimeters, about 200 mm, at least about 200 millimeters, about 300 mm, at least about 300 mm, about 450 mm, or even at least about 450 mm. The terminal diameter of the outwardly flaring seed-cone 170 is generally equivalent to the diameter of the constant diameter of the main ingot body 180 of the single crystal silicon ingot.

After formation of the neck and the outwardly flaring seed-cone 170 adjacent the neck portion, the main ingot body 180 having a constant diameter adjacent the outwardly flaring seed-cone 170 is then grown. The constant diameter portion of the main ingot body 180 has a circumferential edge, a central axis that is parallel to the circumferential edge, and a radius that extends from the central axis to the circumferential edge. The central axis also passes through the cone portion and neck. The diameter of the main ingot body 180 may vary and, in some embodiments, the diameter may be about 150 mm, at least about 150 millimeters, about 200 mm, at least about 200 millimeters, about 300 mm, at least about 300 mm, about 450 mm, or even at least about 450 mm. Stated another way, the radial length of the solid main ingot body 180 of the single crystal silicon ingot is about 75 mm, at least about millimeters, about 100 mm, at least about 100 millimeters, about 150 mm, at least about 150 mm, about 225 mm, or even at least about 225 mm. The main ingot body 180 of the single crystal silicon ingot is eventually grown to be at least about 1000 millimeters long, such as at least 1200 millimeters long, such as at least 1250 millimeters long, such as at least 1400 millimeters long, such as at least 1500 millimeters long, or at least 2000 millimeters long, or at least 2200 millimeters, such as 2200 millimeters, or at least about 3000 millimeters long, or at least about 4000 millimeters long. In some preferred embodiments, the total axial length of the solid main ingot body 180 of the single crystal silicon ingot is at least about 1100 mm, such as between about 1200 mm and about 1300 mm, such as between about 1200 mm and about 1250 mm.

In some embodiments, the main ingot body 180 may be pulled according to a pull rate protocol. The pull rate declines from a relatively high pull rate, to a minimum pull rate, and then rising to a constant pull rate for a significant portion of growth of the main body of the single crystal silicon ingot. The initial high pull rate may be between about 0.5 mm/min and about 2.0 mm/min, such as about 1.0 mm/min, then decreasing to a pull rate that may be as low as about 0.4 mm/min or even as low as about 0.3 mm/min, before increasing to the constant pull rate between about 0.4 mm/min and about 0.8 mm/min, between about mm/min and about 0.7 mm/min, or between about 0.4 mm/min and about 0.65 mm/min.

In a continuous Czochralski method, during growth of the main ingot body 180 of the single crystal silicon ingot, polycrystalline silicon, i.e., granular, chunk, or a combination of granular and chunk, is added to the molten silicon to thereby achieve a constant volume of molten silicon and constant melt elevation level. According to the method of the present invention, maintenance of a substantially constant melt volume during growth of a substantial portion of the axial length of the main body of the single crystal silicon ingot enables the achievement of high ingot quality over a substantial portion of the axial length of the main body of the single crystal silicon ingot at a constant pull rate. The constant melt volume regardless of the crystal length enables maintaining a constant crystal/melt interface and thus uniform crystal quality over a substantial portion of the main body of the ingot. Accordingly, in some embodiments, the volume of molten silicon varies by no more than about 1.0 volume % during growth of at least about 90% the main body of the single crystal silicon ingot, or by no more than about 0.5 volume % during growth of at least about 90% the main body of the single crystal silicon ingot, or even by no more than about 0.1 volume % during growth of at least about 90% the main body of the single crystal silicon ingot. Stated another way, in some embodiments, the melt elevation level varies by less than about +/−0.5 millimeter during growth of at least about 90% the main body of the single crystal silicon ingot.

In a batch Czochralski method, the initial charge of polycrystalline silicon is sufficient to grow the entire length of the ingot. Rather than maintain a constant melt elevation level, the silicon melt volume declines as the ingot grows. Accordingly, with Reference to FIG. 4 (inset), the crucible 110 holds molten silicon 120, from which the crystal ingot 140 is drawn. As illustrated from FIG. 4 sections a) through j), the initial charge of solid polycrystalline silicon 150 is melted to form the melt 120 by application of heat from the heater 130. A seed crystal 160 is brought into contact with the molten silicon 120, and a single crystal ingot 140 is grown by slow extraction. As can be seen in the illustration, as the length of the single crystal silicon ingot 140 increases, the volume of molten silicon 120 is depleted, necessitating the vertical movement of the crucible 110 in the same direction in which the ingot is pulled.

Figure 5:
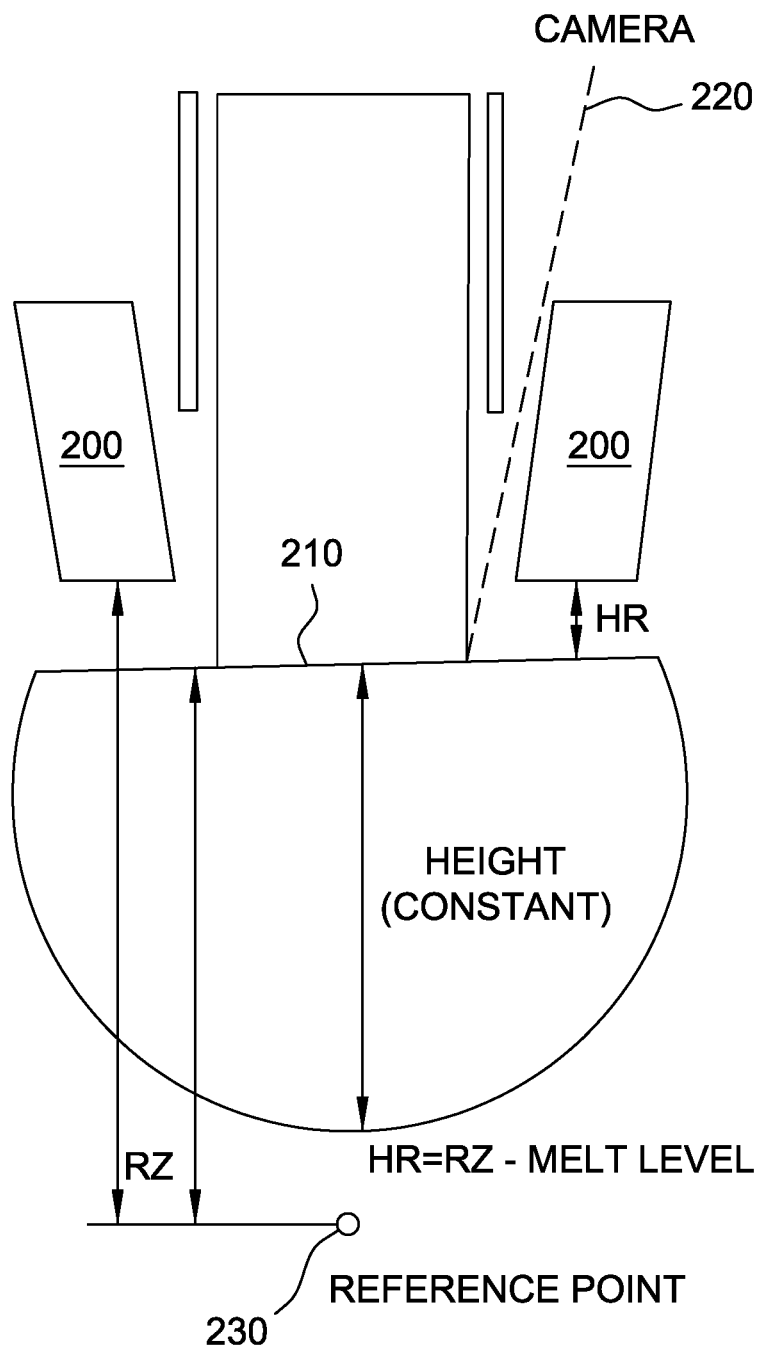
FIG. 5 is a simplified depiction of the hot zone configuration suitable for use in the method of the present invention.

Regardless of whether the method is batch or continuous, growth conditions are selected to achieve an optimized melt side heat flux, temperature near the melt, and temperature gradients near the meniscus in order to grow an ingot having reduced or eliminated distortion along the entire length of the main body of the ingot. Among these growth conditions is the monitoring of the relative height of the bottom of the reflector 200 above the surface of the melt 210, with reference to FIG. 5. The relative height "HR" can be measured directly as a distance between the bottom of the reflector 200 and the melt level 210, as shown in FIG. 3, the vector labeled "HR." If the configuration of the hot zone does not enable direct measurement, i.e., the camera 220 cannot locate the bottom of the reflector 200, the relative height "HR" can be measured indirectly with a reference point located, for example, below the crucible. The distance between the melt level and the reference point 230 is measured, and the distance between the bottom of the reflector 200 and the reference point 230, which is labeled "RZ" is measured. The relative height, "HR", is calculated by subtracting the distance between the melt level 210 and the reference point 230 from "RZ." In a batch process, the melt level changes as the ingot is grown. Accordingly, the crucible must be moved, i.e., raised, in order to maintain a desired "HR."

Figure 7A:
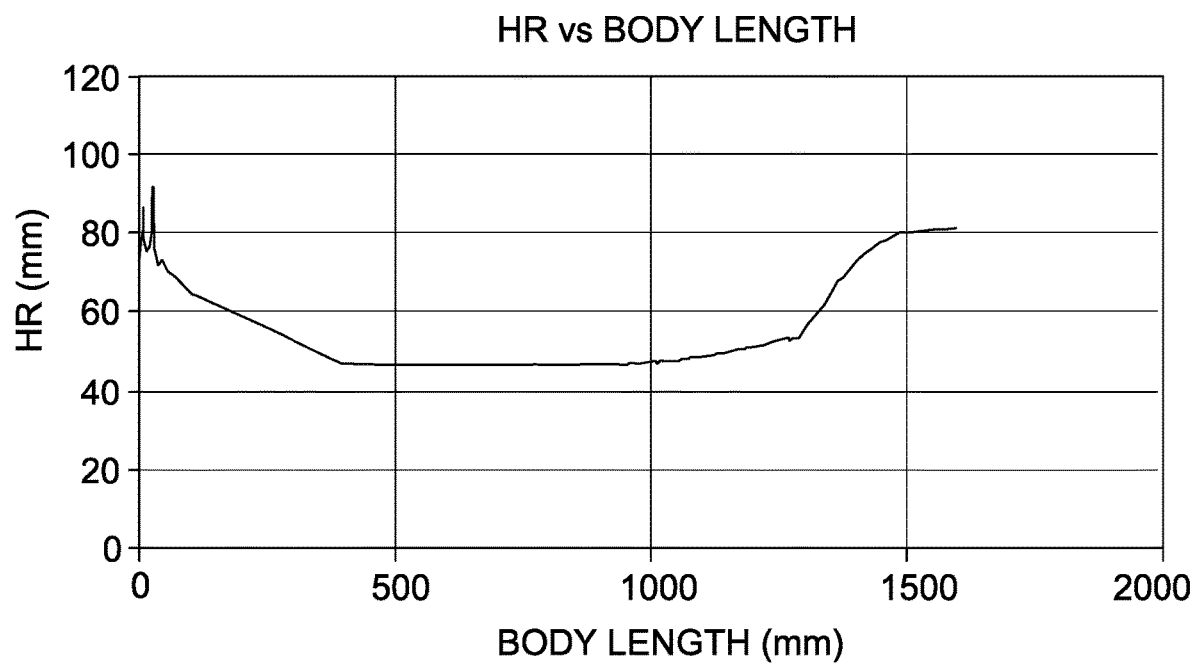
FIGS. 7A and 7B are graphs depicting relative crucible relative height (HR) protocols during growth of an ingot according to some embodiments of the method of the present invention.
Figure 7B:
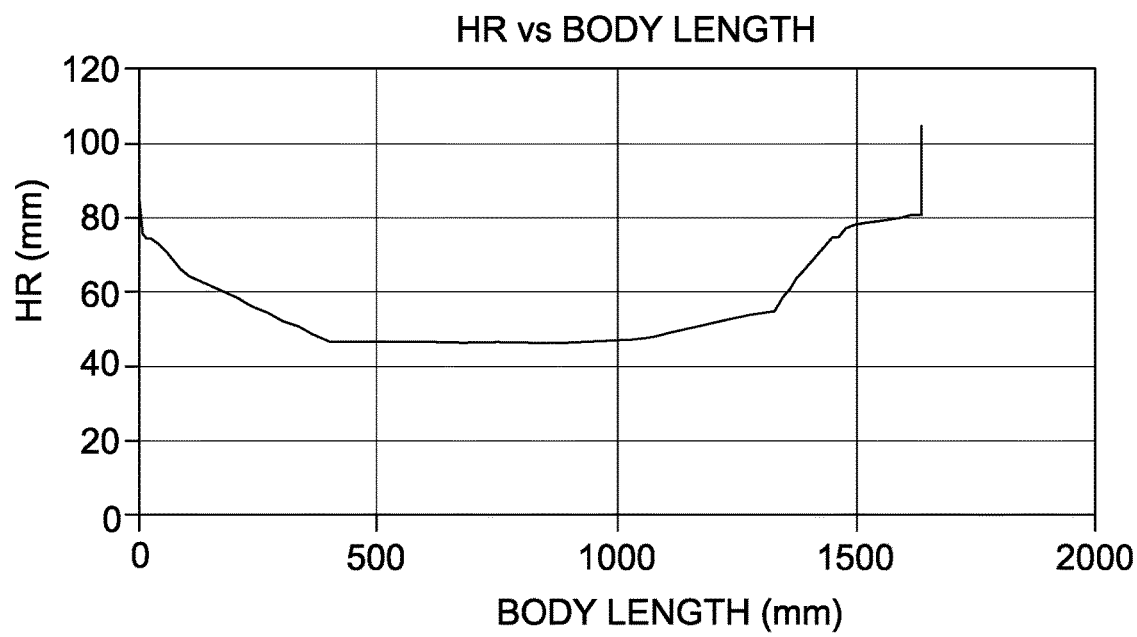

According to some embodiments, the "HR" begins with a relatively high value, such as between about 60 mm to 120 mm, or between about 70 mm to 100 mm. In some embodiments, the relatively high value of HR occurs during growth of the neck and crown, i.e., outwardly flaring seed cone, of the single crystal silicon ingot. The HR distance is large initially to allow the camera to capture the meniscus in the necking and crowning stage. The HR value is large initially to keep the meniscus in the view window of the camera tracking it. In some embodiments, the relatively high value of HR may continue during growth of the initial part of the ingot body, for example, during growth of the first 200 mm to 400 mm of the ingot body. In some embodiments, after growth of the neck and crown, the distance between the bottom of the reflector and the melt level is rapidly decreased by bringing the crucible close to the bottom of the reflector. In some embodiments, the distance between the bottom of the reflector and the melt level may be closed at a rate of at least −0.05 millimeter per millimeter of ingot growth, or at least about −0.06 millimeter per millimeter of ingot growth, such as about −0.065 millimeter per millimeter of ingot growth, preferably less than about −0.1 millimeter per millimeter of ingot growth, or less than about −0.08 millimeter per millimeter of ingot growth. The values are stated as negative since the relative height is decreasing from a higher value to a lower value. In some embodiments, the HR is brought to a distance between 40 mm and 50 mm during growth of a significant portion of the main body of the ingot, such as between 45 mm and 50 mm, or between 45 mm and 48 mm. In some embodiments, the HR is brought to a distance of 45 mm during growth of a significant portion of the main body of the ingot. In some embodiments, the HR is brought to a distance of 47 mm during growth of a significant portion of the main body of the ingot. These HR distances apply to growth of at least about 50%, at least about 60%, at least about 70% of the length of the main body of the ingot. "HR" profiles according to exemplary embodiments of the present invention are shown in FIGS. 7A and 7B. The crystal edge gradient is altered by the HR values according to the present invention, and the defects profile in the crystal is controlled by this crystal edge gradient. So basically, the defects profile decides to what value the HR is ramped to and when should the ramp be started. For instance, in the early body, the crystal gets heated a lot from the side and thus is pulled at a low rate initially to get the desired diameter and then the seed lift is ramped. Since this seed lift changes with the body length there is a need to change the temperature gradient also to control the defects, which in turn is controlled by changing the HR during the crystal growth. As shown therein, the "HR" is maintained at a constant low value for most of the growth of the main body of the ingot, which is rapidly increased as the ingot is completed and pulled from the remaining melt.

Figure 8A:
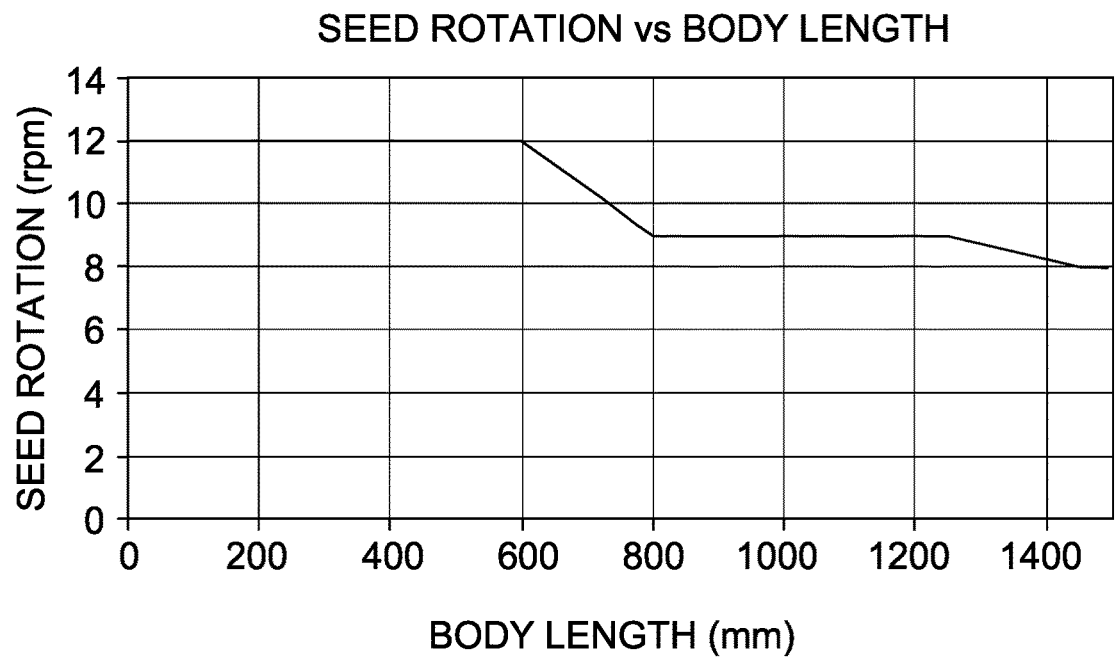
FIGS. 8A and 8B are graphs depicting seed rotation rate protocols during growth of an ingot according to some embodiments of the method of the present invention.
Figure 8B:
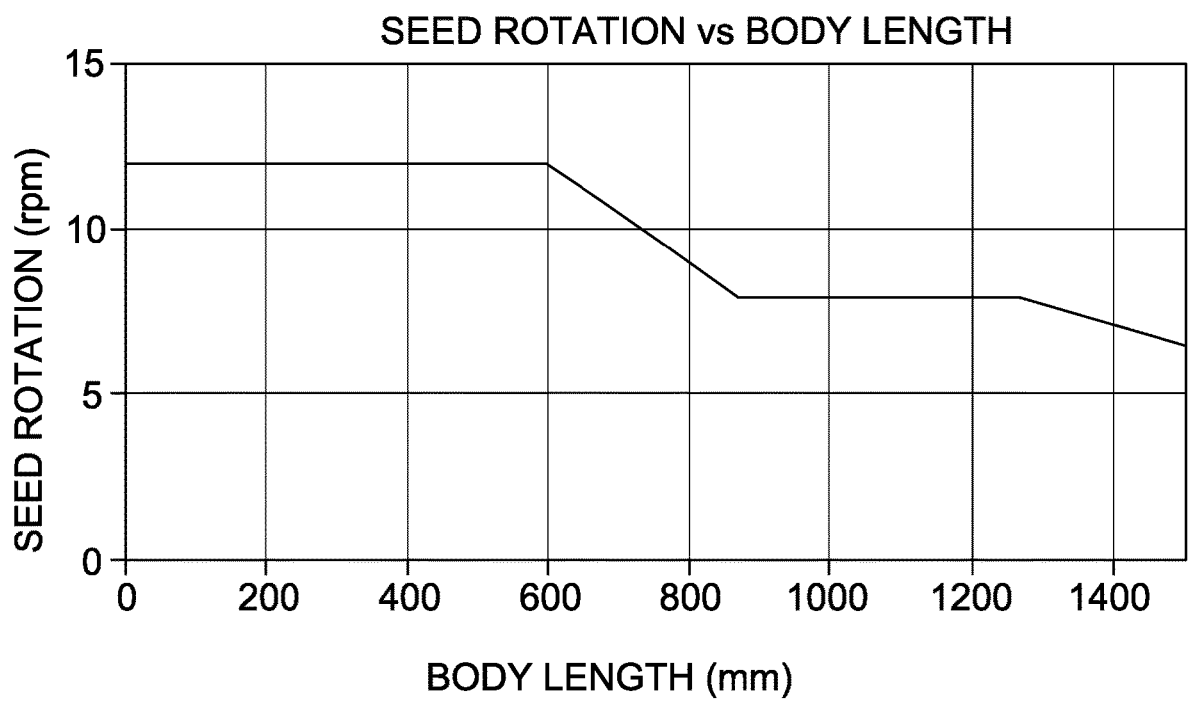

In some embodiments, the lower HR is combined with a lower seed rotation rate during growth of a significant length of the single crystal silicon ingot main body. In some embodiments, the seed rotation rate may start at an initial high rate. The high seed rotation rate is suitable for growing the initial portion of the ingot since the melt temperature and heat flux are generally high during growth of the first 200 to 600 mm of the length of the main body. In some embodiments, the initial seed rotation rate may be at least about 10 rpm, such as at least about 11 rpm, or even at least about 12 rpm. In some preferred embodiments, the initial seed rotation rate may be at least about 11 rpm. After growth of an initial portion of the ingot, the seed rotation rate is decreased. In some embodiments, the seed rotation rate may be decreased at a rate from about −0.005 rpm per millimeter of ingot growth to about −0.020 rpm per millimeter of ingot growth, such as from about −0.005 rpm per millimeter of ingot growth to about −0.014 rpm per millimeter of ingot growth. The values are stated as negative since the seed rotation rate is decreasing from a higher value to a lower value. Decreasing the seed rotation rates within this range may bring the seed rotation rate to between about 5 rpm and about 10 rpm, such as about 8 rpm, about 9 rpm, or about 10 rpm between about 600 mm to about 900 mm of ingot body length. In some preferred embodiments, the seed rotation rate may be about 9 rpm between about 600 mm to about 900 mm of ingot body length. In some embodiments, the rotation rates may be decreased further, such as between about 5 rpm and about 8 rpm, such as about 7 rpm or about 8 rpm, at late body growth, such as after about 1200 mm of growth. In some preferred embodiments, the rotation rates may be about 7 rpm, at late body growth, such as after about 1200 mm of growth. In some preferred embodiments, the rotation rates may be about 8 rpm, at late body growth, such as after about 1200 mm of growth. Selecting these seed rotation values results in a higher temperature gradient in the melt region near the solid-liquid interface and the meniscus temperatures could also be increased. Very low seed rotation values can result in degrading the oxygen radial gradient. Seed rotation rate profiles according to exemplary embodiments of the present invention are shown in FIGS. 8A and 8B.

Additionally, according to the process of the present invention, a magnetic field may be applied to the crucible comprising the silicon melt. Either cusp or horizontal magnet field can be applied to set the appropriate crystal/melt interface, i.e., the shape and height of the meniscus. The magnetic field is used to fix a desire crystal/melt interface shape and height primarily, and control of the oxygen content, Oi, is a subordinate purpose.

Control of the melt flow and the shape of the melt/solid interface and therefore the quality of the ingot may be enhanced by the application of a magnetic field to the silicon melt during growth of the main body of the single crystal silicon ingot. In some embodiments, the applied magnetic field maintains a substantially constant melt/solid interface profile during at least about 70% of the growth of the main body of the single crystal silicon ingot, or between about 70% and about 90% of the growth of the main body of the single crystal silicon ingot. The magnetic field applies electromagnetic force, which affects the silicon melt flow, so the heat transfer in the melt is affected. It changes the profile of crystal/melt interface and the temperature of growing crystal.

The magnetic field impacts the oxygen content and uniformity in the ingot. The source of oxygen is the ingot is from dissolution of the quartz crucible wall, evaporation SiOx (g) at the melt free surface (controlled by melt flow kinetics) and incorporation into growing crystal front. The magnet field impacts the convective melt flow during growth which can impact Oxygen evaporation and incorporation. The variation of oxygen incorporation into the single crystal silicon ingot by time increment is controlled by the diffusion and convection of oxygen in the melt according to the following equation:

$$\frac{\partial C}{\partial t} = \nabla C - v\rho + \text{SOURCE.}$$

C is the concentration of oxygen is the solidifying silicon, t is time, v is the convection velocity (melt flow velocity), rho, $\rho$, is the density of silicon melt, $\nabla$ is the gradient (d/dx). The applied magnetic field affects the melt velocity (v) and the gradient of oxygen concentration in the melt (dC/dx=$\nabla$C). Since magnetic field results in a steady state melt flow, the incorporating of oxygen, Oi, into the ingot is time constant, which enhances radial and axial oxygen concentration uniformity. The SOURCE term is derived from two parameters, the dissolution of quartz ($SiO_2$) crucible which is the generation of oxygen (Si (l)+$SiO_2$(s)→SiOx(g)), and the evaporation which is the removal (disappearance) of oxygen (SiOx(g)) from melt. In a batch Cz process, this SOURCE term is not constant. Instead, it depends upon the crystal length since the melt mass decreases as the crystal is grown. When the ingot has grown a substantial portion of its body length, the remaining melt volume is low, so that that amount of silicon melt in contact with the crucible is decreased, which therefore leads to lower concentrations of oxygen incorporated from the crucible into the melt. Therefore, the oxygen incorporated into solidifying silicon crystal is decreased, if other terms (diffusion, convection, evaporation) are constant. The melt free surface (contact surface between melt and gas) area affects the evaporation rate of SiOx(g). Less evaporation of SiOx(g) means more oxygen incorporation into the solidifying silicon crystal. According to the method of the present invention, the melt mass is maintained as constant since polysilicon is added as the crystal ingot grows. Accordingly, all source terms (generation of Oxygen by $SiO_2$ crucible dissolution into melt, and evaporation of SiOx(g) gas through melt free surface) are constant. Therefore, the diffusion and convection terms affect the oxygen of solidifying silicon crystal. The applied magnetic field makes melt flow more stable (i.e., melt flow is constant like as time independent steady condition), so incorporating Oxygen is uniform and stable in the axial and radial directions during growth of the entire length of the ingot. In some embodiments, interstitial oxygen may be incorporated into the ingot in a concentration between about 4 PPMA and about 18 PPMA. In some embodiments, interstitial oxygen may be incorporated into the ingot in a concentration between about 10 PPMA and about 35 PPMA. In some embodiments, the ingot comprises oxygen in a concentration of no greater than about 15 PPMA, or no greater than about 10 PPMA. Interstitial oxygen may be measured according to SEMI MF 1188-1105.

In some embodiments, a horizontal magnetic field is applied to the silicon melt during growth of the main body of the single crystal silicon ingot. Crystal growth in presence of a horizontal magnetic field is achieved by placing the crucible holding the silicon melt between the poles of a conventional electromagnet. In some embodiments, the horizontal magnetic field may have a magnetic flux density between about 0.2 Tesla and about 0.4 Tesla in the melt area. Magnetic field variation in the melt is less than +/−about 0.03 Tesla in a given strength. Application of a horizontal magnetic field gives rise to Lorentz force along axial direction, in a direction opposite of fluid motion, opposing forces driving melt convection. The convection in the melt is thus suppressed, and the axial temperature gradient in the crystal near the interface increases. The melt-crystal interface then moves upward to the crystal side to accommodate the increased axial temperature gradient in the crystal near the interface and the contribution from the melt convection in the crucible decreases.

Figure 9:
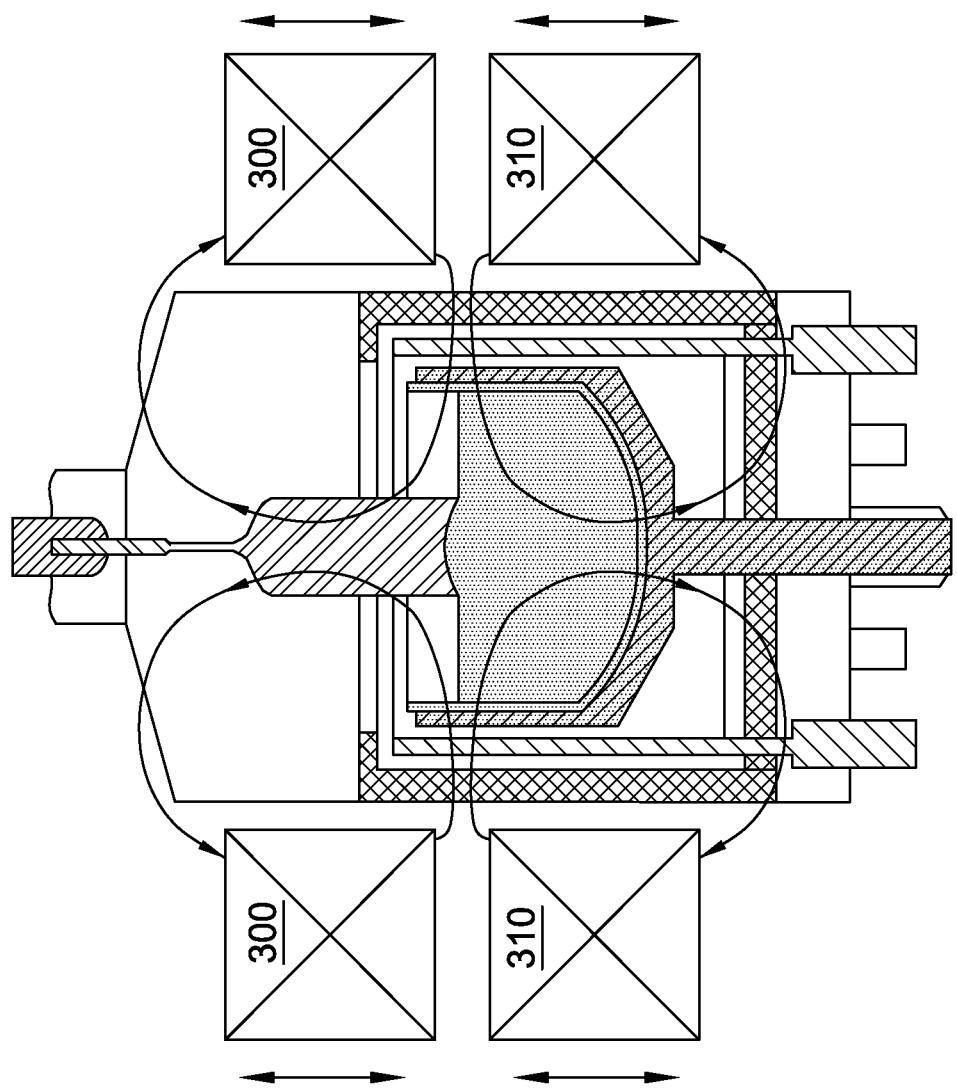
FIG. 9 illustrates the location of the magnetic coils suitable for generating a cusp magnetic field.

In some embodiments, a cusp magnetic field is applied to the silicon melt during growth of the main body of the single crystal silicon ingot. Magnetic coil locations suitable for achieving a cusp magnetic field is illustrated in FIG. 9. A cusp magnetic field has two controlling parameters, namely the magnetic flux density and magnetic field shape. A cusp magnetic field applies a horizontal (radial) magnetic field component at the nearest surface of the melt combined with a vertical (axial) magnetic field deeper in the melt near the axis of the ingot. The cusp magnetic field is generated using a pair of Helmholtz coils 300, 310 carrying current in opposite direction. As a result, at the position halfway between the two magnetic fields, vertically along the ingot axis, the magnetic fields cancel each other out to make a vertical magnetic field component at or near zero. For example, the cusp magnetic flux density is typically about zero to about 0.2 Tesla in the axial direction. The magnetic flux density in the radial direction is generally higher than the magnetic flux density in the vertical direction. For example, the cusp magnetic flux density is typically between about 0 and about 0.6 T in the radial position, such as between about 0.2 and about 0.5 T, dependent upon the radial position. The radial cusp magnetic field restrains the flow of the melt, to thereby stabilize the melt. In other words, application of a radial cusp magnetic field induces convection at a portion adjacent to the solid-liquid interface at which crystal growth occurs, and suppresses convection at the remaining portions of the melt, to thereby serve as an effective method for realizing uniform oxygen distribution. Thermal melt convection can be locally and independently controlled by the cusp magnetic field at the melt free surface and at the melt crucible interface at the same time. This enables to control the oxygen concentration in the growing crystal by magnetic flux density only, irrespective of crystal rotation speed. In presence of an axial or a radial magnetic field, control of oxygen concentration is achieved via control of crystal rotation speed. Application of the cusp magnetic field may enable growth on an ingot comprising less oxygen content than an ingot grown without an applied magnetic field, such as no greater than about 15 PPMA, or no greater than about 10 PPMA. Interstitial oxygen may be measured according to SEMI MF 1188-1105.

Figures 10A, 10B, 10C:
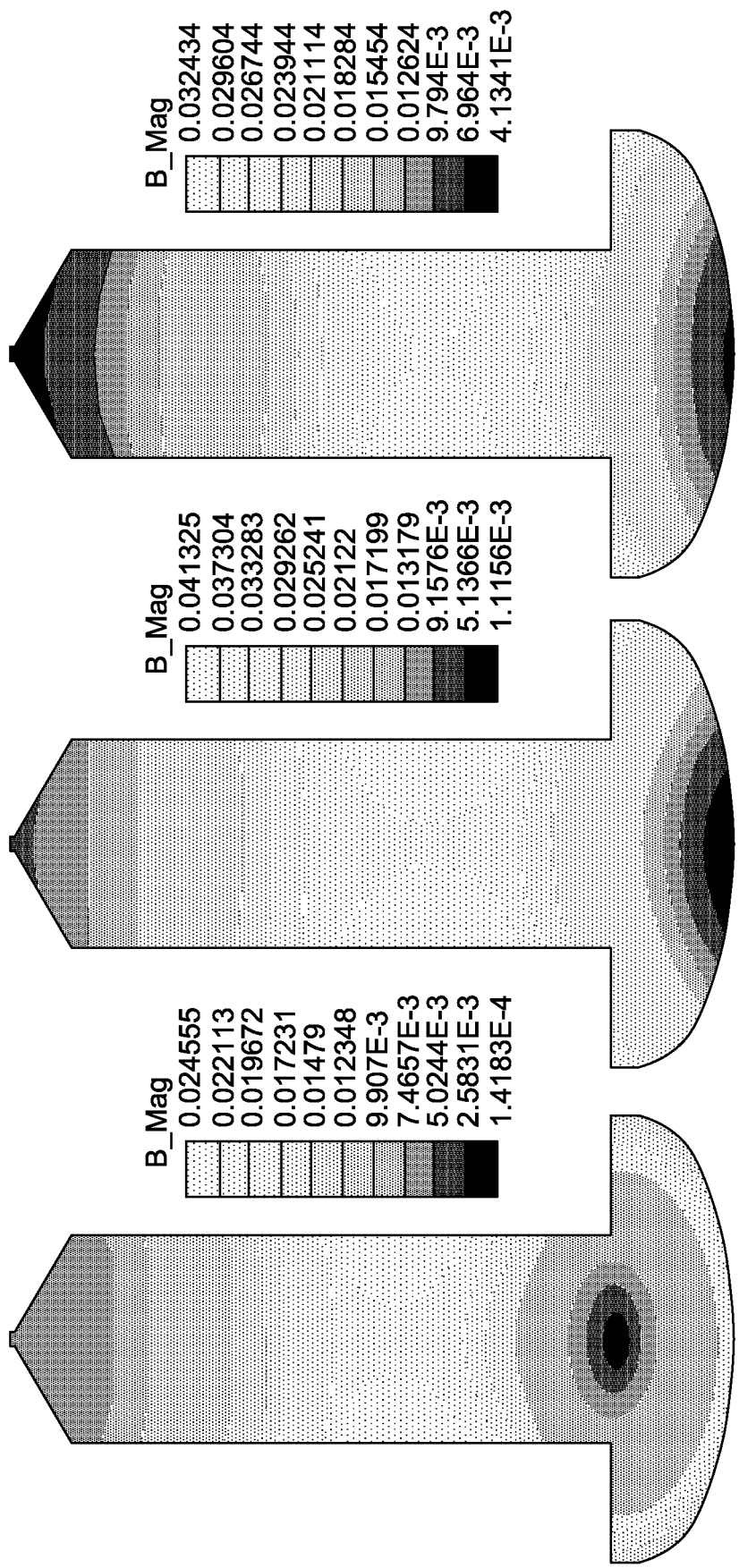
FIGS. 10A, 10B, and 10C illustrate the magnetic field strength and cusp position during Czochralski crystal growth during a conventional method (FIG. 10A) and during methods according to the present invention (FIGS. 10B and 10C).

According to the method of the present invention, the cusp magnetic field applied to the silicon melt during growth of the main body of the single crystal silicon ingot is derived from an upper magnetic coil 300 and a lower magnetic coil 310, wherein the upper magnetic field strength derived from the upper magnetic coil 300 is greater than a lower magnetic field strength derived from the lower magnetic coil 310. In some embodiments, the upper magnetic field strength derived from the upper magnetic coil 300 exceeds a lower magnetic field strength derived from the lower magnetic coil 310 by at least 10%, or at least 15%. By applying a greater magnetic field strength to the upper magnetic coil compared to the lower magnetic coil, the cusp position may be moved lower into the melt, as illustrated in FIGS. 10B and 10C, as compared to a conventional method as illustrated in FIG. 10A. Lowering the cusp position has been found to increase the temperature in the meniscus region.

According to the method of the present invention, the conditions disclosed herein minimize the temperature changes at the free melt surface level as well as the melt under the melt/crystal interface in the late body as no distortion is seen in the early body. The conditions according to the method of the present invention help in preventing the melt temperatures near the crystal/melt interface and meniscus to drop which in turn reduces the potential of supercooling and thus distortion. Advantageous factors that achieve the desired outcome are the melt side heat flux, the temperature near the melt, and the temperature gradients near the meniscus which could be increased by selecting HR, seed rotation, and magnetic cusp conditions.

Melt side heat flux is determined according to the following equation:

$$Q_{melt} = k_m * \left(\frac{dT}{dx}\right)_m$$

where $k_m$ is the thermal conductivity of the melt and $$\left(\frac{dT}{dx}\right)_m$$

is the axial temperature gradient. The heat flux depends on the axial temperature gradient in the melt. Thus, with reference to FIG. 6, a greater heat flux results in a larger axial temperature gradient which means higher temperatures in the melt 90 under the melt/crystal interface 92 and higher temperature gradients near the meniscus 94 which results in reduced ingot distortion along the axial length of the ingot 100. According to some embodiments, a heat flux in an axial direction between the melt-solid interface 92 and the free melt elevation level 96 during growth of at least 40% of a total axial length of the solid main body of the single crystal silicon ingot 100 has an absolute value of at least about 20,000 W/m$^2$, at least about 21,000 W/m$^2$, at least about 22,000 W/m$^2$, at least about 23,000 W/m$^2$, or at least about 24,000 W/m$^2$ over at least about 85% of the radial length of the solid main body of the single crystal silicon ingot 100. According to some embodiments, the heat flux in the axial direction between the melt-solid interface 92 and the free melt elevation level 96 during growth of at least 60% of the axial length of the solid main body of the single crystal silicon ingot 100 has an absolute value of at least about 20,000 W/m$^2$, at least about 21,000 W/m$^2$, at least about 22,000 W/m$^2$, at least about 23,000 W/m$^2$, or at least about 24,000 W/m$^2$ over at least about 85% of the radial length of the solid main body of the single crystal silicon ingot 100. According to some embodiments, the heat flux in the axial direction between the melt-solid interface 92 and the free melt elevation level 96 during growth of at least 80% of the axial length of the solid main body of the single crystal silicon ingot 100 has an absolute value of at least about 20,000 W/m$^2$, at least about 21,000 W/m$^2$, at least about 22,000 W/m$^2$, at least about 23,000 W/m$^2$, or at least about 24,000 W/m$^2$ over at least about 80% of the diameter of the solid main body of the single crystal silicon ingot 100. According to some embodiments, the heat flux in the axial direction between the melt-solid interface 92 and the free melt elevation level 96 during growth of at least 90% of a total length of the solid main body of the single crystal silicon ingot 100 has an absolute value of at least about 20,000 W/m$^2$, at least about 21,000 W/m$^2$, at least about 22,000 W/m$^2$, at least about 23,000 W/m$^2$, or at least about 24,000 W/m$^2$ over at least about 85% of the radial length of the solid main body of the single crystal silicon ingot 100. According to some embodiments, the heat flux in the axial direction between the melt-solid interface 92 and the free melt elevation level 96 during growth of at least 95% of a total length of the solid main body of the single crystal silicon ingot 100 has an absolute value of at least about 20,000 W/m$^2$, at least about 21,000 W/m$^2$, at least about 22,000 W/m$^2$, at least about 23,000 W/m$^2$, or at least about 24,000 W/m$^2$ over at least about 85% of the radial length of the solid main body of the single crystal silicon ingot 100.

Still further, conditions are selected to achieve a temperature gradient along the meniscus 94 curve. See FIG. 6. According to some embodiments, a temperature gradient along a meniscus 94 curve between the melt-solid interface 92 and the free melt elevation level 96 has an average value of at least about 0.16K/mm or at least about 0.18K/mm during growth of at least 40% of a total length of the solid main body of the single crystal silicon ingot 100. According to some embodiments, a temperature gradient along a meniscus 94 curve between the melt-solid interface 92 and the free melt elevation level 96 has an average value of at least about 0.16K/mm or at least about 0.18K/mm during growth of at least 60% of a total length of the solid main body of the single crystal silicon ingot 100. According to some embodiments, a temperature gradient along a meniscus 94 curve between the melt-solid interface 92 and the free melt elevation level 96 has an average value of at least about or at least about 0.18K/mm during growth of at least 80% of a total length of the solid main body of the single crystal silicon ingot 100. According to some embodiments, a temperature gradient along a meniscus 94 curve between the melt-solid interface 92 and the free melt elevation level 96 has an average value of at least about 0.16K/mm or at least about during growth of at least 90% of a total length of the solid main body of the single crystal silicon ingot 100.

By achieving these melt flux and temperature gradients, the temperature of the molten silicon at the meniscus 94 is higher than can be conventionally achieved in a low power hot zone. According to some embodiments, a temperature of the molten silicon in the meniscus 94 is at least 1691K, or at least 1692K, as measured at the free melt elevation level 96 during growth of at least 40% of a total length of the solid main body of the single crystal silicon ingot 100. According to some embodiments, a temperature of the molten silicon in the meniscus 94 is at least 1691K, or at least 1692K, as measured at the free melt elevation level 96 during growth of at least 60% of a total length of the solid main body of the single crystal silicon ingot 100. According to some embodiments, a temperature of the molten silicon in the meniscus 94 is at least 1691K, or at least 1692K, as measured at the free melt elevation level 96 during growth of at least 80% of a total length of the solid main body of the single crystal silicon ingot 100. According to some embodiments, a temperature of the molten silicon in the meniscus 94 is at least 1691K, or at least 1692K, as measured at the free melt elevation level 96 during growth of at least 85% of a total length of the solid main body of the single crystal silicon ingot 100. According to some embodiments, a temperature of the molten silicon in the meniscus 94 is at least 1691K, or at least 1692K, as measured at the free melt elevation level 96 during growth of at least 90% of a total length of the solid main body of the single crystal silicon ingot 100.

Figure 11A:
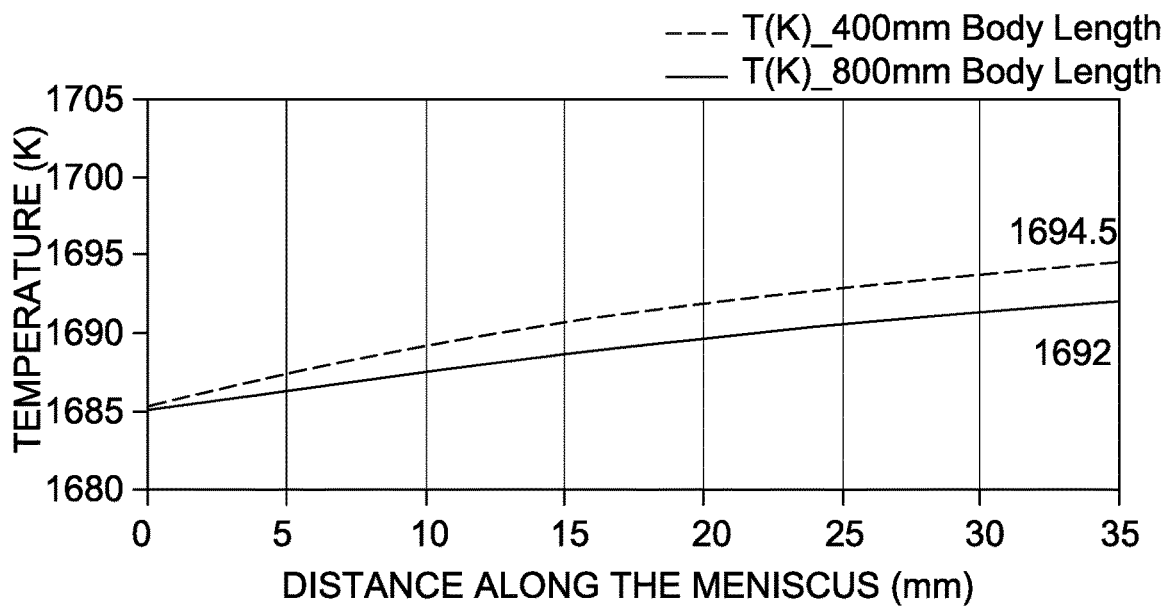
FIGS. 11A and 11B depict meniscus temperature profile (FIG. 11A) and heat flux on the melt side (FIG. 11B) according to an embodiment of the present invention. Temperatures and heat flux data were obtained after 400 mm growth and after 800 mm growth.
Figure 11B:
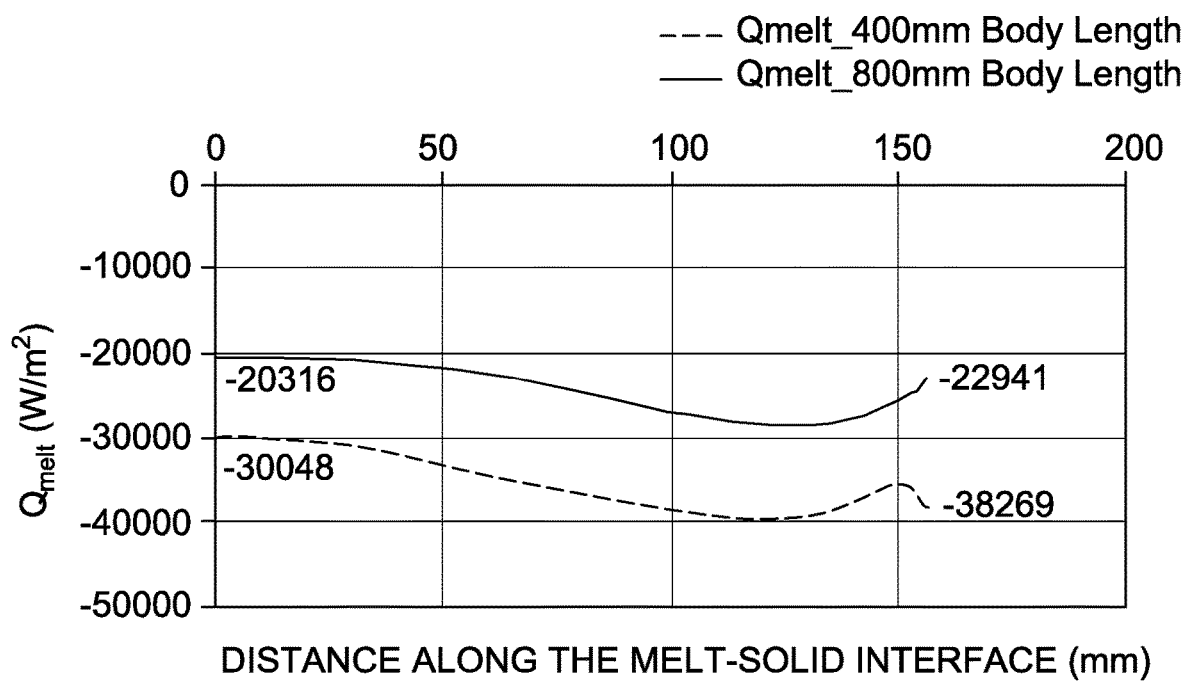

In some embodiments, process conditions suitable for achieving the meniscus 94 temperature profile and melt flux on the melt side are depicted in FIGS. 11A and 11B include bottom heater power (BH)=0 kW, seed rotation rate (SR)=9 rpm, and relative height (HR)=47 mm (Test Condition 1). The heat flux (Qmelt) value is the measurement of heat flux into the melt 90 across the crystallization front. The negative values signify the heat movement from the melt 90 to the crystal 100 across the melt/solid interface 92. As shown in FIG. 11A, the meniscus 94 temperature is at least 1692K along the meniscus 94 curve at both 400 mm and 800 mm axial growth. Moreover, the heat flux has an absolute value greater than 20,000 W/m$^2$ over the radial length of the melt-solid interface 92 at both 400 mm and 800 mm axial growth, as shown in FIG. 11B.

Figure 12A:
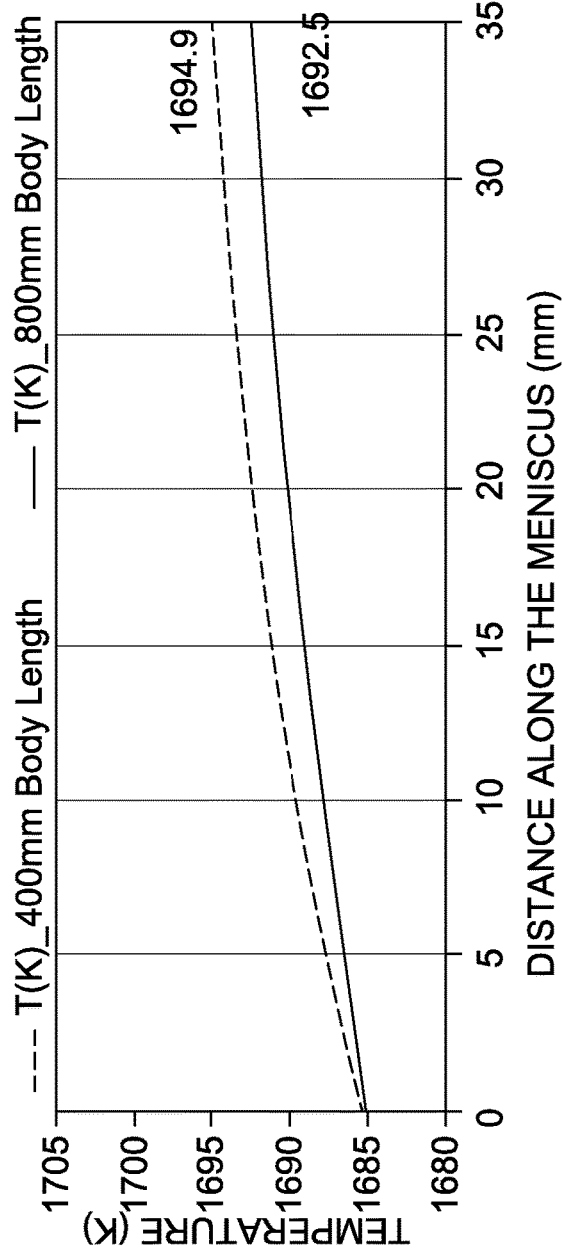
FIGS. 12A and 12B depict meniscus temperature profile (FIG. 12A) and heat flux on the melt side (FIG. 12B)
Figure 12B:
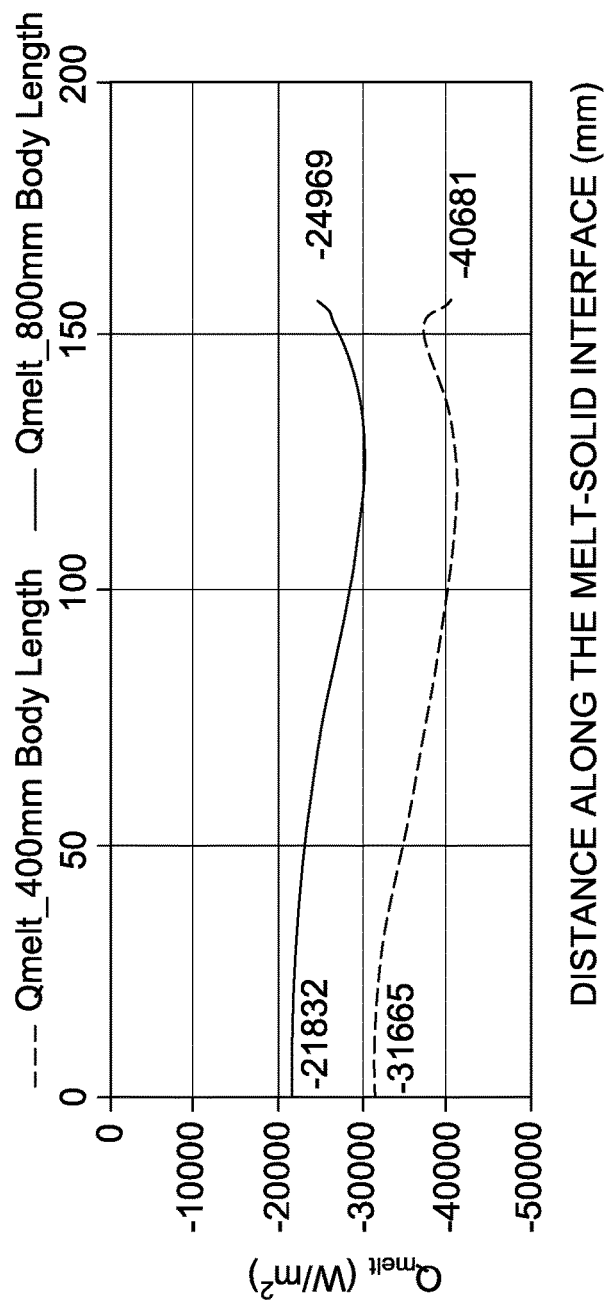

In some embodiments, process conditions suitable for achieving the meniscus 94 temperature profile and melt flux on the melt side are depicted in FIGS. 12A and 12B include bottom heater power (BH)=0 kW, seed rotation rate (SR)=9 rpm, and relative height (HR)=45 mm (Test Condition 1). The heat flux (Qmelt) value is the measurement of heat flux into the melt 90 across the crystallization front. The negative values signify the heat movement from the melt 90 to the crystal 100 across the melt/solid interface 92. As shown in FIG. 12A, the meniscus 94 temperature is at least 1692K along the meniscus 94 curve at both 400 mm and 800 mm axial growth. Moreover, the heat flux has an absolute value greater than 20,000 W/m$^2$ over the radial length of the melt-solid interface 92 at both 400 mm and 800 mm axial growth, as shown in FIG. 12B.

In some embodiments, it was found that when the magnetic cusp position is lowered, the temperature in the meniscus region increases. To lower the magnetic cusp position, a gap of 15% between the upper and the lower magnet, with the upper magnet at a higher strength. A comparison between the temperature profile in the meniscus region and the heat flux on the melt side was done as shown below in FIGS. 13A and 13B. The lower temperatures and gradient shown in FIG. 13A pertains to conventional low power hot zone (conventional LPHZ) with a magnetic cusp position exemplified in FIG. 10A. The higher temperatures and gradient shown in FIG. 13A pertains to the hot zones according to embodiments of the present invention (Test Condition 1 and Test Condition 2) with cusp positions exemplified in FIGS. 10B and 10C. Accordingly, cusp magnetic field position, along with seed rotation rate and relative height, may be combined to increase the meniscus temperature profile.

The process of the present invention enables growth of single crystal silicon ingots in which the deviation from the setpoint diameters is minimized. Minimizing/reducing distortion results in an actual diameter profile for the grown crystal close to the set point values. With reference to FIG. 14A, conventional low power hot zone processes may result in significant deviation from the desired crystal diameter. The set point diameter is represented by the solid line, and FIG. 14A demonstrates that actual diameters may deviate significantly from the set point diameter. With reference to FIG. 14B, some vibration and deviation may still occur, however, the process of the present invention enables the growth of crystals in which the diameters values remain close to the set point values. In view thereof, the process of the present invention results in crystals having diameters that vary little around the set point values, thereby reducing ingot distortion over the entire length of the main body of the ingot.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method of preparing a single crystal silicon ingot by a Czochralski method, the method comprising:
    adding an initial charge of polycrystalline silicon to a crucible contained within a growth chamber, wherein the crucible comprises a bottom wall and a sidewall and further wherein the growth chamber comprises insulation configured to insulate the bottom wall of the crucible, a side heater located next to the sidewall, and a reflector;
    supplying power to the side heater to thereby heat the crucible comprising the initial charge of polycrystalline silicon to cause a silicon melt to form in the crucible, wherein the silicon melt has a free melt level;
    contacting a silicon seed crystal with the silicon melt contained within the crucible;
    withdrawing the silicon seed crystal from the silicon melt in a direction perpendicular to the free melt level at an initial pull rate to thereby form a solid neck portion of the single crystal silicon ingot;
    withdrawing a solid outwardly flaring seed-cone adjacent the neck portion of the single crystal silicon ingot from the silicon melt by modifying the initial pull rate to thereby achieve an outwardly flaring seed-cone pull rate; and
    withdrawing a solid main body of the single crystal silicon ingot adjacent the outwardly flaring seed-cone from the silicon melt by modifying the outwardly flaring seed-cone pull rate to thereby achieve a main body pull rate, wherein withdrawing the solid main body of the single crystal silicon ingot includes rotating the seed crystal at a seed crystal rotation rate and controlling a relative height (HR) measured as a distance between the free melt level and a bottom of the reflector, wherein the solid main body of the single crystal silicon ingot has a radial length and an axial length and surface tension arising as the solid main body of the single crystal silicon ingot is withdrawn from the silicon melt results in a melt-solid interface located above the free melt level and further wherein a meniscus comprising molten silicon is between the melt-solid interface and the free melt level;
    wherein a cusp magnetic field is applied to the silicon melt during growth of the main body of the single crystal silicon ingot;
    wherein, during growth of a first portion of the solid main body of the single crystal silicon ingot, the seed crystal rotation rate is at least 11 rpm and the HR is a distance between 60 mm and 120 mm; and
    wherein, after growth of the first portion and during growth of a second portion of the solid main body of the single crystal silicon ingot comprising at least 40% of the total axial length of the solid main body, the seed crystal rotation rate is between 5 rpm and 10 rpm and the HR is a distance between 40 mm and 50 mm such that a heat flux in an axial direction between the melt-solid interface and the free melt level during growth of the second portion of the solid main body of the single crystal silicon ingot has an absolute value of at least 20,000 W/m$^2$ over at least 85% of the radial length of the solid main body of the single crystal silicon ingot.

2. The method of claim 1 wherein the total axial length of the solid main body of the single crystal silicon ingot is at least 1100 mm.

3. The method of claim 1 wherein the total axial length of the solid main body of the single crystal silicon ingot is between 1200 mm and 1300 mm.

4. The method of claim 1 wherein the radial length of the solid main body of the single crystal silicon ingot is at least 75 millimeters.

5. The method of claim 1 wherein the radial length of the solid main body of the single crystal silicon ingot is at least 150 mm.

6. The method of claim 1 wherein the second portion of the solid main body of the single crystal silicon ingot comprises at least 60% of the axial length of the solid main body of the single crystal silicon ingot.

7. The method of claim 1 wherein the second portion of the solid main body of the single crystal silicon ingot comprises at least 80% of the axial length of the solid main body of the single crystal silicon ingot.

8. The method of claim 1 wherein the second portion of the solid main body of the single crystal silicon ingot comprises at least 90% of the axial length of the solid main body of the single crystal silicon ingot.

9. The method of claim 1 wherein a temperature gradient along the meniscus has an average value of at least 0.16K/mm during growth of the second portion of the solid main body of the single crystal silicon ingot.

10. The method of claim 9 wherein the second portion of the solid main body of the single crystal silicon ingot comprises at least 60% of the axial length of the solid main body of the single crystal silicon ingot.

11. The method of claim 9 wherein the second portion of the solid main body of the single crystal silicon ingot comprises at least 80% of the axial length of the solid main body of the single crystal silicon ingot.

12. The method of claim 1 wherein a temperature gradient along the meniscus has an average value of at least 0.18K/mm during growth of the second portion of the solid main body of the single crystal silicon ingot.

13. The method of claim 12 wherein the second portion of the solid main body of the single crystal silicon ingot comprises at least 60% of the axial length of the solid main body of the single crystal silicon ingot.

14. The method of claim 12 wherein the second portion of the solid main body of the single crystal silicon ingot comprises at least 80% of the axial length of the solid main body of the single crystal silicon ingot.

15. The method of claim 1 wherein a temperature of the molten silicon in the meniscus is at least 1691K as measured at the free melt level during growth of the second portion of the solid main body of the single crystal silicon ingot.

16. The method of claim 15 wherein the second portion of the solid main body of the single crystal silicon ingot comprises at least 60% of the axial length of the solid main body of the single crystal silicon ingot.

17. The method of claim 15 wherein the second portion of the solid main body of the single crystal silicon ingot comprises at least 85% of the axial length of the solid main body of the single crystal silicon ingot.

18. The method of claim 1 wherein a temperature of the molten silicon in the meniscus is at least 1692K as measured at the free melt level during growth of the second portion of the solid main body of the single crystal silicon ingot.

19. The method of claim 18 wherein the second portion of the solid main body of the single crystal silicon ingot comprises at least 60% of the axial length of the solid main body of the single crystal silicon ingot.

20. The method of claim 18 wherein the second portion of the solid main body of the single crystal silicon ingot comprises at least 85% of the axial length of the solid main body of the single crystal silicon ingot.

21. The method of claim 1 wherein the cusp magnetic field applied to the silicon melt during growth of the main body of the single crystal silicon ingot is derived from an upper magnetic coil and a lower magnetic coil, and further wherein an upper magnetic field strength derived from the upper magnetic coil is greater than a lower magnetic field strength derived from the lower magnetic coil.

22. The method of claim 1 wherein the cusp magnetic field applied to the silicon melt during growth of the main body of the single crystal silicon ingot is derived from an upper magnetic coil and a lower magnetic coil, and further wherein an upper magnetic field strength derived from the upper magnetic coil exceeds a lower magnetic field strength derived from the lower magnetic coil by at least 10%.

* * * * *